United States Patent
Lee et al.

(10) Patent No.: US 9,680,506 B2
(45) Date of Patent: *Jun. 13, 2017

(54) DTV TRANSMITTING SYSTEM AND METHOD OF PROCESSING BROADCAST DATA

(71) Applicant: LG Electronics Inc., Seoul (KR)

(72) Inventors: Hyoung Gon Lee, Seoul (KR); In Hwan Choi, Seoul (KR); Kook Yeon Kwak, Seoul (KR); Jong Moon Kim, Seoul (KR); Won Gyu Song, Seoul (KR); Byoung Gill Kim, Seoul (KR); Jin Woo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/208,161

(22) Filed: Jul. 12, 2016

(65) Prior Publication Data

US 2016/0322988 A1 Nov. 3, 2016

Related U.S. Application Data

(63) Continuation of application No. 14/861,504, filed on Sep. 22, 2015, now Pat. No. 9,425,827, which is a
(Continued)

(30) Foreign Application Priority Data

Apr. 29, 2006 (KR) .................. 10-2006-0039118
Sep. 15, 2006 (KR) .................. 10-2006-0089736

(51) Int. Cl.
*H03M 13/00* (2006.01)
*H03M 13/27* (2006.01)
(Continued)

(52) U.S. Cl.
CPC ... *H03M 13/2792* (2013.01); *H03M 13/1515* (2013.01); *H03M 13/2703* (2013.01);
(Continued)

(58) Field of Classification Search
CPC ....... H04L 1/0041; H04L 1/005; H04L 1/006; H04L 1/0065; H04L 1/007; H04L 1/0071;
(Continued)

(56) References Cited

U.S. PATENT DOCUMENTS

| 4,642,755 A | 2/1987 | Hinch |
| 5,177,796 A | 1/1993 | Feig et al. |

(Continued)

FOREIGN PATENT DOCUMENTS

| CA | 2404404 | 3/2003 |
| CN | 1533174 | 9/2004 |

(Continued)

OTHER PUBLICATIONS

Cardarilli et al; FPGA oriented design of parity sharing RS codecs; IEEE 2005.
(Continued)

*Primary Examiner* — Guy Lamarre
(74) *Attorney, Agent, or Firm* — Dentons US LLP

(57) ABSTRACT

A DTV transmitting system includes an encoder, a randomizer, a block processor, a group formatter, a deinterleaver, and a packet formatter. The encoder codes enhanced data for error correction, permutes the coded data, and further codes the permuted data for error detection. The randomizer randomizes the coded enhanced data, and the block processor codes the randomized data at an effective coding rate of 1/H. The group formatter forms a group of enhanced data having data regions, and inserts the coded enhanced data into at least one of the data regions. The deinterleaver deinterleaves
(Continued)

the group of enhanced data, and the packet formatter formats the deinterleaved data into corresponding data bytes.

8 Claims, 15 Drawing Sheets

Related U.S. Application Data continuation of application No. 14/607,640, filed on Jan. 28, 2015, now Pat. No. 9,178,536, which is a continuation of application No. 14/181,461, filed on Feb. 14, 2014, now Pat. No. 8,984,381, which is a continuation of application No. 13/850,163, filed on Mar. 25, 2013, now Pat. No. 8,689,086, which is a continuation of application No. 12/717,111, filed on Mar. 3, 2010, now Pat. No. 8,429,504, which is a continuation of application No. 11/741,102, filed on Apr. 27, 2007, now Pat. No. 7,739,581.

(60) Provisional application No. 60/821,251, filed on Aug. 2, 2006.

(51) Int. Cl.
| | | |
|---|---|---|
| *H04L 1/00* | (2006.01) | |
| *H04N 21/235* | (2011.01) | |
| *H04N 21/236* | (2011.01) | |
| *H04N 21/2383* | (2011.01) | |
| *H04N 21/434* | (2011.01) | |
| *H04N 21/435* | (2011.01) | |
| *H04N 21/438* | (2011.01) | |
| *H03M 13/15* | (2006.01) | |

(52) U.S. Cl.
CPC ........ *H03M 13/6522* (2013.01); *H04L 1/007* (2013.01); *H04L 1/0041* (2013.01); *H04L 1/0047* (2013.01); *H04L 1/0054* (2013.01); *H04L 1/0058* (2013.01); *H04L 1/0061* (2013.01); *H04L 1/0065* (2013.01); *H04L 1/0071* (2013.01); *H04N 21/235* (2013.01); *H04N 21/2383* (2013.01); *H04N 21/23614* (2013.01); *H04N 21/435* (2013.01); *H04N 21/4348* (2013.01); *H04N 21/4382* (2013.01)

(58) Field of Classification Search
CPC . H04L 27/3405; H04L 1/0061; H04N 21/238; H04N 21/2383; H04N 21/4382; H03M 13/1515
USPC .............. 714/752, 756, 758, 776, 780, 784; 375/265, E7.026, 240.01, 301
See application file for complete search history.

(56) References Cited

U.S. PATENT DOCUMENTS

| | | |
|---|---|---|
| 5,208,816 A | 5/1993 | Seshardi et al. |
| 5,258,987 A | 11/1993 | Wei |
| 5,301,167 A | 4/1994 | Proakis et al. |
| 5,488,635 A | 1/1996 | Chennakeshu et al. |
| 5,502,506 A | 3/1996 | Choi |
| 5,508,752 A | 4/1996 | Kim et al. |
| 5,511,096 A | 4/1996 | Huang et al. |
| 5,544,060 A | 8/1996 | Fujii et al. |
| 5,602,593 A | 2/1997 | Katto |
| 5,606,569 A | 2/1997 | Macdonald et al. |
| 5,619,269 A | 4/1997 | Lee et al. |
| 5,636,251 A | 6/1997 | Citta et al. |
| 5,691,993 A | 11/1997 | Fredrickson |
| 5,754,651 A | 5/1998 | Blatter et al. |
| 5,757,416 A | 5/1998 | Birch et al. |
| 5,771,239 A | 6/1998 | Moroney et al. |
| 5,867,503 A | 2/1999 | Ohsuga et al. |
| 5,896,181 A | 4/1999 | Takamori |
| 5,903,324 A | 5/1999 | Lyons et al. |
| 5,956,373 A | 9/1999 | Goldston et al. |
| 5,978,424 A | 11/1999 | Turner |
| 6,005,894 A | 12/1999 | Kumar |
| 6,016,309 A | 1/2000 | Benayoun et al. |
| 6,021,421 A | 2/2000 | Retter et al. |
| 6,049,651 A | 4/2000 | Oshima |
| 6,075,569 A | 6/2000 | Lee et al. |
| 6,124,898 A | 9/2000 | Patel et al. |
| 6,211,800 B1 | 4/2001 | Yanagihara et al. |
| 6,212,659 B1 | 4/2001 | Zehavi |
| 6,219,386 B1 | 4/2001 | Amrany et al. |
| 6,226,380 B1 | 5/2001 | Ding |
| 6,232,917 B1 | 5/2001 | Baumer et al. |
| 6,233,295 B1 | 5/2001 | Wang |
| 6,243,469 B1 | 6/2001 | Kataoka et al. |
| 6,272,660 B1 | 8/2001 | Chen et al. |
| 6,285,681 B1 | 9/2001 | Kolze et al. |
| 6,289,485 B1 | 9/2001 | Shiomoto |
| 6,334,187 B1 | 12/2001 | Kadono |
| 6,339,618 B1 | 1/2002 | Puri et al. |
| 6,351,290 B1 | 2/2002 | Limberg |
| 6,356,598 B1 | 3/2002 | Wang |
| 6,373,534 B1 | 4/2002 | Yasuki et al. |
| 6,373,634 B1 | 4/2002 | Nishikawa |
| 6,405,338 B1 | 6/2002 | Sinha et al. |
| 6,411,253 B1 | 6/2002 | Cox et al. |
| 6,446,234 B1 | 9/2002 | Cox et al. |
| 6,456,611 B1 | 9/2002 | Hu et al. |
| 6,459,741 B1 | 10/2002 | Grabb et al. |
| 6,470,047 B1 | 10/2002 | Kleinerman et al. |
| 6,490,007 B1 | 12/2002 | Bouillet et al. |
| 6,498,936 B1 | 12/2002 | Raith |
| 6,512,759 B1 | 1/2003 | Hashimoto et al. |
| 6,515,713 B1 | 2/2003 | Nam |
| 6,553,538 B2 | 4/2003 | Zehavi |
| 6,573,947 B1 | 6/2003 | Oh |
| 6,577,685 B1 | 6/2003 | Bao et al. |
| 6,636,892 B1 | 10/2003 | Philyaw |
| 6,650,880 B1 | 11/2003 | Lee et al. |
| 6,651,250 B1 | 11/2003 | Takai |
| 6,665,308 B1 | 12/2003 | Rakib et al. |
| 6,665,343 B1 | 12/2003 | Jahanghir et al. |
| 6,671,002 B1 | 12/2003 | Konishi et al. |
| 6,686,880 B1 | 2/2004 | Marko et al. |
| 6,687,310 B1 | 2/2004 | Fimoff et al. |
| 6,693,984 B1 | 2/2004 | Andre |
| 6,694,518 B1 | 2/2004 | Dulac |
| 6,704,358 B1 | 3/2004 | Li et al. |
| 6,731,700 B1 | 5/2004 | Yakhnich et al. |
| 6,734,920 B2 | 5/2004 | Ghosh et al. |
| 6,738,949 B2 | 5/2004 | Senda et al. |
| 6,744,474 B2 | 6/2004 | Markman |
| 6,744,822 B1 | 6/2004 | Gaddam et al. |
| 6,744,821 B1 | 6/2004 | Nishigaki |
| 6,760,077 B2 | 7/2004 | Choi et al. |
| 6,768,517 B2 | 7/2004 | Limberg et al. |
| 6,775,334 B1 | 8/2004 | Liu et al. |
| 6,775,521 B1 | 8/2004 | Chen |
| 6,775,664 B2 | 8/2004 | Lang et al. |
| 6,803,970 B1 | 10/2004 | Limberg et al. |
| 6,810,084 B1 | 10/2004 | Jun et al. |
| 6,810,090 B1 | 10/2004 | Perlow |
| 6,816,204 B1 | 11/2004 | Limberg |
| 6,827,941 B1 | 12/2004 | Lüddecke et al. |
| 6,842,875 B2 | 1/2005 | Kondo et al. |
| 6,850,562 B1 | 2/2005 | Dornstetter et al. |
| 6,904,110 B2 | 6/2005 | Trans et al. |
| 6,909,743 B1 | 6/2005 | Ward et al. |
| 6,917,655 B2 | 7/2005 | Fimoff et al. |
| 6,922,215 B2 | 7/2005 | Choi et al. |
| 6,924,753 B2 | 8/2005 | Bretl et al. |
| 6,925,126 B2 | 8/2005 | Lan et al. |
| 6,927,708 B2 | 8/2005 | Fimoff |
| 6,931,198 B1 | 8/2005 | Hamada et al. |
| 6,934,331 B2 | 8/2005 | Kamikura et al. |

(56) References Cited

U.S. PATENT DOCUMENTS

| | | |
|---|---|---|
| 6,937,648 B2 | 8/2005 | Raphaeli |
| 6,944,242 B2 | 9/2005 | Yakhnich et al. |
| 6,947,487 B2 | 9/2005 | Choi et al. |
| 6,952,595 B2 | 10/2005 | Ikedo et al. |
| 6,956,619 B2 | 10/2005 | Choi et al. |
| 6,973,137 B2 | 12/2005 | Birru et al. |
| 6,975,689 B1 | 12/2005 | McDonald et al. |
| 6,977,914 B2 | 12/2005 | Paila et al. |
| 6,977,977 B1 | 12/2005 | Dubrovin et al. |
| 6,980,603 B2 | 12/2005 | Choi et al. |
| 6,984,110 B2 | 1/2006 | Jang |
| 6,985,420 B2 | 1/2006 | Shishido |
| 6,985,537 B1 | 1/2006 | Milbar |
| 6,993,021 B1 | 1/2006 | Chuah et al. |
| 6,993,062 B1 | 1/2006 | Kong et al. |
| 6,996,133 B2 | 2/2006 | Bretl et al. |
| 7,010,038 B2 | 3/2006 | Choi et al. |
| 7,020,451 B2 | 3/2006 | Sugar et al. |
| 7,030,935 B2 | 4/2006 | Choi et al. |
| 7,038,732 B1 | 5/2006 | Limberg et al. |
| 7,042,949 B1 | 5/2006 | Omura et al. |
| 7,050,419 B2 | 5/2006 | Azenkot et al. |
| 7,079,584 B2 | 7/2006 | Feher |
| 7,085,324 B2 | 8/2006 | Choi et al. |
| 7,092,447 B2 | 8/2006 | Choi et al. |
| 7,092,455 B2 | 8/2006 | Choi et al. |
| 7,093,179 B2 | 8/2006 | Shea |
| 7,095,707 B2 | 8/2006 | Rakib et al. |
| 7,096,484 B2 | 8/2006 | Mao et al. |
| 7,102,692 B1 | 9/2006 | Carlsgaard et al. |
| 7,111,221 B2 | 9/2006 | Birru et al. |
| 7,130,313 B2 | 10/2006 | Pekonen |
| 7,148,932 B2 | 12/2006 | Choi et al. |
| 7,151,575 B1 | 12/2006 | Landry et al. |
| 7,170,849 B1 | 1/2007 | Arivoli et al. |
| 7,194,047 B2 | 3/2007 | Strolle et al. |
| 7,197,685 B2 | 3/2007 | Limberg |
| 7,206,352 B2 | 4/2007 | Birru et al. |
| 7,209,459 B2 | 4/2007 | Kangas |
| 7,218,671 B2 | 5/2007 | Jeong et al. |
| 7,218,672 B2 | 5/2007 | Birru |
| 7,221,358 B2 | 5/2007 | Sasaki |
| 7,221,680 B2 | 5/2007 | Vijayan et al. |
| 7,230,654 B2 | 6/2007 | Liu et al. |
| 7,246,296 B2 | 7/2007 | Yokokawa et al. |
| 7,277,709 B2 | 10/2007 | Vadgama |
| 7,295,623 B2 | 11/2007 | Raghavan |
| 7,333,153 B2 | 2/2008 | Hartson et al. |
| 7,334,176 B2 | 2/2008 | Schroder |
| 7,343,487 B2 | 3/2008 | Lindqvist et al. |
| 7,356,549 B1 | 4/2008 | Bruso et al. |
| 7,376,074 B2 | 5/2008 | Jung et al. |
| 7,376,186 B2 | 5/2008 | Boyce et al. |
| 7,400,820 B2 | 7/2008 | Uchida et al. |
| 7,406,647 B2 | 7/2008 | Lakkis |
| 7,440,410 B2 | 10/2008 | Ojard et al. |
| 7,440,516 B2 | 10/2008 | Kim et al. |
| 7,450,613 B2 | 11/2008 | Choi et al. |
| 7,450,628 B2 | 11/2008 | Feher |
| 7,454,683 B2 | 11/2008 | Vesma et al. |
| 7,460,606 B2 | 12/2008 | Choi et al. |
| 7,474,695 B2 | 1/2009 | Liu et al. |
| 7,548,582 B2 | 6/2009 | Kim et al. |
| 7,590,187 B2 | 9/2009 | Jeong et al. |
| 7,590,917 B2 | 9/2009 | Barry et al. |
| 7,593,474 B2 | 9/2009 | Jeong et al. |
| 7,620,118 B2 | 11/2009 | Choi |
| 7,634,006 B2 | 12/2009 | Choi et al. |
| 7,644,343 B2 | 1/2010 | Gubbi et al. |
| 7,646,828 B2 | 1/2010 | Song et al. |
| 7,653,143 B2 | 1/2010 | Kim et al. |
| 7,675,994 B2 | 3/2010 | Gaddam et al. |
| 7,698,621 B2 | 4/2010 | Choi et al. |
| 7,701,850 B2 | 4/2010 | Kim et al. |
| 7,705,920 B2 | 4/2010 | Lee et al. |
| 7,733,426 B2 | 6/2010 | Lee et al. |
| 7,733,819 B2 | 6/2010 | Lee et al. |
| 7,733,820 B2 | 6/2010 | Choi et al. |
| 7,739,581 B2 | 6/2010 | Lee et al. |
| 7,764,323 B2 | 7/2010 | Choi et al. |
| 7,779,337 B2 | 8/2010 | Song et al. |
| 7,782,958 B2 | 8/2010 | Lee et al. |
| 7,783,960 B2 | 8/2010 | Choi et al. |
| 7,796,697 B2 | 9/2010 | Kim et al. |
| 7,797,607 B2 | 9/2010 | Choi et al. |
| 7,822,134 B2 | 10/2010 | Kim et al. |
| 7,823,052 B2 | 10/2010 | Yu et al. |
| 7,826,575 B2 | 11/2010 | Yang et al. |
| 7,840,882 B2 | 11/2010 | Lee et al. |
| 7,844,009 B2 | 11/2010 | Kim et al. |
| 7,844,012 B2 | 11/2010 | Park et al. |
| 7,848,400 B2 | 12/2010 | Heiman et al. |
| 7,852,961 B2 | 12/2010 | Chang et al. |
| 7,873,103 B2 | 1/2011 | Park et al. |
| 7,876,835 B2 | 1/2011 | Kim et al. |
| 7,882,421 B2 | 2/2011 | Oguz et al. |
| 7,890,980 B2 | 2/2011 | Yun et al. |
| 7,913,152 B2 | 3/2011 | Jeong et al. |
| 7,930,618 B2 | 4/2011 | Yu et al. |
| 7,932,956 B2 | 4/2011 | Choi et al. |
| 7,934,243 B2 | 4/2011 | Song et al. |
| 7,934,244 B2 | 4/2011 | Kim et al. |
| 7,941,735 B2 | 5/2011 | Jeong et al. |
| 7,983,354 B2 | 7/2011 | Park et al. |
| 7,986,715 B2 | 7/2011 | Song et al. |
| 8,009,662 B2 | 8/2011 | Lee et al. |
| 8,019,011 B2 | 9/2011 | Jeong et al. |
| 8,045,935 B2 | 10/2011 | Lakkis et al. |
| 8,050,327 B2 | 11/2011 | Lee et al. |
| 8,050,347 B2 | 11/2011 | Jeong et al. |
| 8,074,147 B2 | 12/2011 | Lee et al. |
| 8,081,716 B2 | 12/2011 | Kang et al. |
| 8,094,727 B2 | 1/2012 | Hong et al. |
| 8,171,369 B2 | 5/2012 | Lee et al. |
| 8,509,051 B2 | 8/2013 | Ling et al. |
| 8,582,596 B2 | 11/2013 | Agrawal et al. |
| 8,826,093 B2 | 9/2014 | Walker et al. |
| 8,984,381 B2 | 3/2015 | Lee et al. |
| 9,178,536 B2 | 11/2015 | Lee et al. |
| 9,425,827 B2 * | 8/2016 | Lee .............. H04L 1/0041 |
| 2001/0011213 A1 | 8/2001 | Hindie et al. |
| 2001/0034867 A1 | 10/2001 | Jaffe et al. |
| 2002/0037058 A1 | 3/2002 | Birru |
| 2002/0046406 A1 | 4/2002 | Chelehmal et al. |
| 2002/0051087 A1 | 5/2002 | Limberg et al. |
| 2002/0056103 A1 | 5/2002 | Gong |
| 2002/0080992 A1 | 6/2002 | Decker et al. |
| 2002/0082767 A1 | 6/2002 | Mintz |
| 2002/0085632 A1 | 7/2002 | Choi et al. |
| 2002/0089078 A1 | 7/2002 | Suzuki et al. |
| 2002/0122511 A1 | 9/2002 | Kwentus et al. |
| 2002/0126222 A1 | 9/2002 | Choi et al. |
| 2002/0136197 A1 | 9/2002 | Owen et al. |
| 2002/0141440 A1 | 10/2002 | Stanley et al. |
| 2002/0150167 A1 | 10/2002 | Demjanenko et al. |
| 2002/0150246 A1 | 10/2002 | Ogino |
| 2002/0154620 A1 | 10/2002 | Azenkot et al. |
| 2002/0154709 A1 | 10/2002 | Choi et al. |
| 2002/0159520 A1 | 10/2002 | Choi et al. |
| 2002/0172154 A1 | 11/2002 | Uchida et al. |
| 2002/0186780 A1 | 12/2002 | Choi et al. |
| 2002/0186790 A1 | 12/2002 | Choi et al. |
| 2002/0187767 A1 | 12/2002 | Meehan |
| 2002/0191716 A1 | 12/2002 | Xia et al. |
| 2002/0194570 A1 | 12/2002 | Birru et al. |
| 2003/0002495 A1 | 1/2003 | Shahar et al. |
| 2003/0046431 A1 | 3/2003 | Belleguie |
| 2003/0067899 A9 | 4/2003 | Chen et al. |
| 2003/0093798 A1 | 5/2003 | Rogerson |
| 2003/0099303 A1 | 5/2003 | Birru et al. |
| 2003/0137765 A1 | 7/2003 | Yamazaki et al. |
| 2003/0152107 A1 | 8/2003 | Pekonen |
| 2003/0206053 A1 | 11/2003 | Xia et al. |
| 2003/0223516 A1 | 12/2003 | Zhang et al. |

(56) References Cited

U.S. PATENT DOCUMENTS

| | | |
|---|---|---|
| 2003/0223519 A1 | 12/2003 | Jeong et al. |
| 2003/0234890 A1 | 12/2003 | Bae et al. |
| 2004/0022278 A1 | 2/2004 | Thomas et al. |
| 2004/0028076 A1 | 2/2004 | Strolle et al. |
| 2004/0034491 A1 | 2/2004 | Kim |
| 2004/0061645 A1 | 4/2004 | Seo et al. |
| 2004/0064574 A1 | 4/2004 | Kurauchi |
| 2004/0071241 A1 | 4/2004 | Bouillet et al. |
| 2004/0090997 A1 | 5/2004 | Choi et al. |
| 2004/0100588 A1 | 5/2004 | Hartson et al. |
| 2004/0101046 A1 | 5/2004 | Yang et al. |
| 2004/0105507 A1 | 6/2004 | Chang et al. |
| 2004/0110522 A1 | 6/2004 | Howard et al. |
| 2004/0125235 A1 | 7/2004 | Kim et al. |
| 2004/0141457 A1 | 7/2004 | Seo et al. |
| 2004/0148642 A1 | 7/2004 | Park et al. |
| 2004/0156460 A1 | 8/2004 | Kim et al. |
| 2004/0179616 A1 | 9/2004 | Choi et al. |
| 2004/0181800 A1 | 9/2004 | Rakib et al. |
| 2004/0184547 A1 | 9/2004 | Choi et al. |
| 2004/0246373 A1 | 12/2004 | Kadono et al. |
| 2004/0260985 A1 | 12/2004 | Krieger |
| 2005/0013380 A1 | 1/2005 | Kim et al. |
| 2005/0021827 A1 | 1/2005 | Matsuura |
| 2005/0024543 A1 | 2/2005 | Ramaswamy et al. |
| 2005/0031097 A1 | 2/2005 | Rabenko et al. |
| 2005/0049923 A1 | 3/2005 | Tanaka et al. |
| 2005/0056192 A1 | 3/2005 | Marchand |
| 2005/0060635 A1 | 3/2005 | Eroz |
| 2005/0089095 A1 | 4/2005 | Choi et al. |
| 2005/0090235 A1 | 4/2005 | Vermola et al. |
| 2005/0097428 A1 | 5/2005 | Chang et al. |
| 2005/0111586 A1 | 5/2005 | Kang et al. |
| 2005/0118984 A1 | 6/2005 | Akiyama et al. |
| 2005/0129132 A1 | 6/2005 | Choi et al. |
| 2005/0132413 A1 | 6/2005 | Barreyro et al. |
| 2005/0141606 A1 | 6/2005 | Choi et al. |
| 2005/0152446 A1 | 7/2005 | Choi et al. |
| 2005/0157758 A1 | 7/2005 | Yoo |
| 2005/0162886 A1 | 7/2005 | Jeong et al. |
| 2005/0172208 A1 | 8/2005 | Yoon |
| 2005/0175080 A1 | 8/2005 | Bouillett |
| 2005/0218237 A1 | 10/2005 | Lapstun et al. |
| 2005/0249300 A1 | 11/2005 | Jeong et al. |
| 2005/0249301 A1 | 11/2005 | Jeong et al. |
| 2005/0271158 A1 | 12/2005 | Birru |
| 2006/0015914 A1 | 1/2006 | Lee |
| 2006/0029159 A1 | 2/2006 | Oh et al. |
| 2006/0039460 A1 | 2/2006 | Fimoff et al. |
| 2006/0039503 A1 | 2/2006 | Choi et al. |
| 2006/0052052 A1 | 3/2006 | Jung et al. |
| 2006/0053436 A1 | 3/2006 | Allwein et al. |
| 2006/0072623 A1 | 4/2006 | Park |
| 2006/0078003 A1 | 4/2006 | Watanabe et al. |
| 2006/0078071 A1 | 4/2006 | Lee |
| 2006/0078072 A1 | 4/2006 | Cheon et al. |
| 2006/0085726 A1 | 4/2006 | Rhee et al. |
| 2006/0104391 A1 | 5/2006 | Choi et al. |
| 2006/0126757 A1 | 6/2006 | Choi et al. |
| 2006/0130099 A1 | 6/2006 | Rooyen |
| 2006/0133429 A1 | 6/2006 | Seo et al. |
| 2006/0140301 A1 | 6/2006 | Choi et al. |
| 2006/0146797 A1 | 7/2006 | Lebizay |
| 2006/0146951 A1 | 7/2006 | Chiu |
| 2006/0146955 A1 | 7/2006 | Choi et al. |
| 2006/0159183 A1 | 7/2006 | Gaddam et al. |
| 2006/0181797 A1 | 8/2006 | Sugawara et al. |
| 2006/0203127 A1 | 9/2006 | Choi et al. |
| 2006/0203944 A1 | 9/2006 | Kwak et al. |
| 2006/0212910 A1 | 9/2006 | Endres et al. |
| 2006/0223461 A1 | 10/2006 | Laroia et al. |
| 2006/0227857 A1 | 10/2006 | Gaal |
| 2006/0245488 A1 | 11/2006 | Puputti et al. |
| 2006/0245505 A1 | 11/2006 | Limberg |
| 2006/0245516 A1 | 11/2006 | Simon |
| 2006/0246836 A1 | 11/2006 | Simon |
| 2006/0248563 A1 | 11/2006 | Lee et al. |
| 2006/0253890 A9 | 11/2006 | Park et al. |
| 2006/0262227 A1 | 11/2006 | Jeong |
| 2006/0262744 A1 | 11/2006 | Xu et al. |
| 2006/0262863 A1 | 11/2006 | Park et al. |
| 2006/0268673 A1 | 11/2006 | Roh et al. |
| 2006/0269012 A1 | 11/2006 | Kim et al. |
| 2006/0285608 A1 | 12/2006 | Kim et al. |
| 2007/0019579 A1 | 1/2007 | Xu et al. |
| 2007/0053606 A1 | 3/2007 | Ali |
| 2007/0071110 A1 | 3/2007 | Choi et al. |
| 2007/0076584 A1 | 4/2007 | Kim et al. |
| 2007/0076585 A1 | 4/2007 | Kim et al. |
| 2007/0076586 A1 | 4/2007 | Kim et al. |
| 2007/0076721 A1 | 4/2007 | Kim et al. |
| 2007/0076758 A1 | 4/2007 | Kim et al. |
| 2007/0086488 A1 | 4/2007 | Kim et al. |
| 2007/0092027 A1 | 4/2007 | Yu et al. |
| 2007/0092043 A1 | 4/2007 | Yu et al. |
| 2007/0094566 A1 | 4/2007 | Park et al. |
| 2007/0094567 A1 | 4/2007 | Park et al. |
| 2007/0098114 A1 | 5/2007 | Hundhausen et al. |
| 2007/0110393 A1 | 5/2007 | Jang |
| 2007/0113145 A1 | 5/2007 | Yu et al. |
| 2007/0121681 A1 | 5/2007 | Kang et al. |
| 2007/0127598 A1 | 6/2007 | Kang et al. |
| 2007/0130495 A1 | 6/2007 | Yoon et al. |
| 2007/0135166 A1 | 6/2007 | Ding et al. |
| 2007/0136643 A1 | 6/2007 | Kang et al. |
| 2007/0140368 A1 | 6/2007 | Kim et al. |
| 2007/0140384 A1 | 6/2007 | Choi et al. |
| 2007/0147432 A1 | 6/2007 | Kang et al. |
| 2007/0147549 A1 | 6/2007 | Choi et al. |
| 2007/0147550 A1 | 6/2007 | Choi et al. |
| 2007/0168842 A1 | 7/2007 | Jeong |
| 2007/0168844 A1 | 7/2007 | Jeong et al. |
| 2007/0171941 A1 | 7/2007 | Lee et al. |
| 2007/0172003 A1 | 7/2007 | Kim et al. |
| 2007/0195889 A1 | 8/2007 | Hong et al. |
| 2007/0201544 A1 | 8/2007 | Zhu et al. |
| 2007/0211769 A1 | 9/2007 | Lee et al. |
| 2007/0217499 A1 | 9/2007 | Limberg |
| 2007/0217551 A1 | 9/2007 | Kang et al. |
| 2007/0230387 A1 | 10/2007 | Roh et al. |
| 2007/0230580 A1 | 10/2007 | Kim et al. |
| 2007/0230607 A1 | 10/2007 | Yu et al. |
| 2007/0248055 A1 | 10/2007 | Jain et al. |
| 2007/0253502 A1 | 11/2007 | Park et al. |
| 2007/0268979 A1 | 11/2007 | Chang et al. |
| 2008/0008155 A1 | 1/2008 | Yoon et al. |
| 2008/0019466 A1 | 1/2008 | Limberg |
| 2008/0049824 A1 | 2/2008 | Yang et al. |
| 2008/0063089 A1 | 3/2008 | Chen |
| 2008/0069147 A1 | 3/2008 | Lee et al. |
| 2008/0080082 A1 | 4/2008 | Erden et al. |
| 2008/0095096 A1 | 4/2008 | Cho et al. |
| 2008/0112479 A1 | 5/2008 | Garmany et al. |
| 2008/0117981 A1 | 5/2008 | Lee et al. |
| 2008/0134007 A1 | 6/2008 | Lee et al. |
| 2008/0137525 A1 | 6/2008 | Liu |
| 2008/0151937 A1 | 6/2008 | Lee et al. |
| 2008/0151942 A1 | 6/2008 | Lee et al. |
| 2008/0152035 A1 | 6/2008 | Lee et al. |
| 2008/0159279 A1 | 7/2008 | Younis et al. |
| 2008/0170162 A1 | 7/2008 | Kim et al. |
| 2008/0239161 A1 | 10/2008 | Kim et al. |
| 2008/0240293 A1 | 10/2008 | Kim et al. |
| 2008/0267307 A1 | 10/2008 | Chang et al. |
| 2008/0273121 A1 | 11/2008 | Jeong et al. |
| 2008/0273589 A1 | 11/2008 | Kim et al. |
| 2008/0279270 A1 | 11/2008 | Zeng |
| 2009/0028230 A1 | 1/2009 | Leitner |
| 2009/0034629 A1 | 2/2009 | Suh et al. |
| 2009/0037794 A1 | 2/2009 | Choi et al. |
| 2009/0059086 A1 | 3/2009 | Lee et al. |
| 2009/0060097 A1 | 3/2009 | Kim et al. |
| 2009/0077588 A1 | 3/2009 | Sugai |
| 2009/0103657 A1 | 4/2009 | Park et al. |

(56) References Cited

U.S. PATENT DOCUMENTS

| | | |
|---|---|---|
| 2009/0103660 A1 | 4/2009 | Park et al. |
| 2009/0111486 A1 | 4/2009 | Burstrom |
| 2009/0116580 A1 | 5/2009 | Park et al. |
| 2009/0180571 A1 | 7/2009 | Song et al. |
| 2009/0201997 A1 | 8/2009 | Kim et al. |
| 2009/0262799 A1 | 10/2009 | Limberg |
| 2009/0285137 A1 | 11/2009 | Fujita et al. |
| 2010/0050047 A1 | 2/2010 | Choi et al. |
| 2010/0061476 A1 | 3/2010 | Kim et al. |
| 2010/0115379 A1 | 5/2010 | Gubbi et al. |
| 2010/0118206 A1 | 5/2010 | Gao et al. |
| 2010/0180294 A1 | 7/2010 | Yun et al. |
| 2010/0189122 A1 | 7/2010 | Dandekar et al. |
| 2010/0223528 A1 | 9/2010 | Lee et al. |
| 2010/0226392 A1 | 9/2010 | Lee et al. |
| 2010/0257435 A1 | 10/2010 | Kim et al. |
| 2010/0309969 A1 | 12/2010 | Kim et al. |
| 2010/0310015 A1 | 12/2010 | Choi et al. |
| 2010/0316110 A1 | 12/2010 | Choi et al. |
| 2010/0322091 A1 | 12/2010 | Savoor et al. |
| 2011/0075710 A1 | 3/2011 | Park et al. |
| 2011/0083056 A1 | 4/2011 | Choi et al. |
| 2011/0085603 A1 | 4/2011 | Lee et al. |
| 2011/0116541 A1 | 5/2011 | Choi et al. |
| 2011/0280301 A1 | 11/2011 | Lee et al. |
| 2012/0008716 A1 | 1/2012 | Lee et al. |
| 2013/0232395 A1 | 9/2013 | Lee et al. |

FOREIGN PATENT DOCUMENTS

| | | |
|---|---|---|
| CN | 1582580 | 2/2005 |
| EP | 0526833 | 2/1993 |
| EP | 1061746 | 12/2000 |
| EP | 1211822 | 6/2002 |
| EP | 1566905 | 8/2005 |
| EP | 1628420 | 2/2006 |
| EP | 1689103 | 8/2006 |
| JP | 11261906 | 9/1999 |
| JP | 2000224136 | 8/2000 |
| JP | 2001274769 | 10/2001 |
| JP | 2002218339 | 8/2002 |
| JP | 2003032640 | 1/2003 |
| JP | 2003209525 | 7/2003 |
| JP | 2003284037 | 10/2003 |
| JP | 2004129126 | 4/2004 |
| JP | 2005094354 | 4/2005 |
| JP | 2006148543 | 6/2006 |
| JP | 2007010368 | 1/2007 |
| JP | 2007096403 | 4/2007 |
| KR | 10-0166923 | 3/1999 |
| KR | 1020000040481 | 1/2000 |
| KR | 10-2002-0082268 | 10/2002 |
| KR | 10-2002-0094426 | 12/2002 |
| KR | 10-2003-0011308 | 2/2003 |
| KR | 1020030026236 | 3/2003 |
| KR | 1020030037138 | 5/2003 |
| KR | 20030078354 | 10/2003 |
| KR | 20040032283 | 4/2004 |
| KR | 20040074345 | 8/2004 |
| KR | 10-2004-0104238 | 12/2004 |
| KR | 10-2005-0003367 | 1/2005 |
| KR | 10-2005-0049923 | 5/2005 |
| KR | 1020050065898 | 6/2005 |
| KR | 10-2005-0077255 | 8/2005 |
| KR | 1020050093921 | 9/2005 |
| KR | 10-2005-0097438 | 10/2005 |
| KR | 10-0523054 | 10/2005 |
| KR | 10-2005-0109052 | 11/2005 |
| KR | 10-2005-0111535 | 11/2005 |
| KR | 20050121504 | 12/2005 |
| KR | 1020060009737 | 2/2006 |
| KR | 1020060012510 | 2/2006 |
| KR | 10-2006-0057266 | 5/2006 |
| KR | 1020060039728 | 5/2006 |
| KR | 20060063258 | 6/2006 |
| KR | 20060068989 | 6/2006 |
| KR | 1020060062464 | 6/2006 |
| KR | 1020060063867 | 6/2006 |
| KR | 1020060065435 | 6/2006 |
| KR | 1020060070665 | 6/2006 |
| KR | 1020060072573 | 6/2006 |
| KR | 1020060088622 | 8/2006 |
| KR | 1020060095126 | 8/2006 |
| KR | 1020060095235 | 8/2006 |
| KR | 1020060102160 | 9/2006 |
| KR | 10-2006-0112159 | 10/2006 |
| KR | 20060112499 | 11/2006 |
| KR | 1020060117484 | 11/2006 |
| KR | 100661005 | 12/2006 |
| KR | 1020060133011 | 12/2006 |
| KR | 1020070007995 | 1/2007 |
| KR | 10-2007-0021462 | 2/2007 |
| KR | 10-2007-0032558 | 3/2007 |
| KR | 20070024162 | 3/2007 |
| KR | 1020070034215 | 3/2007 |
| KR | 10-0724891 | 6/2007 |
| KR | 1020070068960 | 7/2007 |
| KR | 20070091962 | 9/2007 |
| WO | 99/21323 | 4/1999 |
| WO | 00/44145 | 7/2000 |
| WO | 00/45552 | 8/2000 |
| WO | 02/37744 | 5/2002 |
| WO | 02/085014 A1 | 10/2002 |
| WO | 03/009197 | 1/2003 |
| WO | 2005/101655 | 10/2005 |
| WO | 2005/109878 | 11/2005 |
| WO | 2006003531 | 1/2006 |
| WO | 2006/030329 A1 | 3/2006 |
| WO | 2006/037925 | 4/2006 |
| WO | 2006/093389 | 9/2006 |
| WO | 2007/008028 | 1/2007 |
| WO | 2007/021157 | 2/2007 |
| WO | 2007/068294 | 6/2007 |
| WO | 2007/091779 | 8/2007 |
| WO | 2008105587 | 9/2008 |
| WO | 2008117981 A1 | 10/2008 |

OTHER PUBLICATIONS

Ardakani et al; Low-Density Parity-Check Coding for Impulse noise correction on power line channels; IEEE 2005.

ETSI, "Digital Video Broadcasting (DVB); DVB-H implementation guidelines" ETSI TR 102 377 v1.2.1, Nov. 2005, 104 pages.

Yao, "IP Datacasting and Channel Error Handling With DVB-H";Proceedings of the 2005 Emerging Information Technology Conference; XP-010856441; Aug. 15, 2005, 3 pages.

Kim, et al.; "Enhanced-x VSB System Development for Improving ATSC Terrestrial DTV Transmission Standard"; IEEE Transactions on Broadcasting, vol. 52, No. 2, Jun. 2006, 8 pages.

Touzni, et al. "Enhanced 8-VSB Transmission for North-American HDTV Terrestrial Broadcast"; Proceedings of the 2003 IEEE International Conference on Acoustics, Speech and Signal Processing; vol. 2, XP010640975, Apr. 6, 2003 4 pages.

Gaddam, et al., "A Newly Proposed ATSC DTV System for Transmitting a Robust Bit-Stream Along With the Standard Bit-Stream", IEEE Transactions on Consumer Electronics, XP001201224; vol. 49; Issue 4; Nov. 2003, 6 pages.

Fimoff, et al., "E-VSB Map Signaling", IEEE Transactions on Consumer Electronics; vol. 49; Issue 3; Aug. 2003, 4 pages.

Uehara, et al., "Transmission Scheme for the Terrestrial ISDB System"; IEEE Transactions on Consumer Electronics; vol. 45; Issue 1; Feb. 1999, 6 pages.

Advanced Television Systems Committee, "ATSC Standard: Digital Television Standard (A/53), Revision D, Including Amendment No. 1", DocA/53D; Jul. 2005, 104 pages.

Chernock, "PSIP Generation and ATSC Stream Monitoring"; WEBE SMPTE, Oct. 2004, 46 pages.

Advanced Television Systems Commitee; "Recommended practice: Guide to the Use of the ATSC Digital television Standard, including Corrigendum No. 1"; Doc A/54A; Dec. 2006, 111 pages.

(56) References Cited

OTHER PUBLICATIONS

DVB, "DVB-H Implementation Guidelines; DVB Document A092 Rev. 02," May 2007, 111 pages.

International Standard; Information Technology—Generic Coding of Moving Pictures and Associated Audio Information: Systems; ISO/IEC 13818-1; Second Edition; Dec. 2000, 174 pages.

Federal Information Processing Standards Publication 197, Announcing the Advanced Encryption Standard (AES); Nov. 2001, 51 pages.

ATSC, "ASTC Recommended Practice: E-VSB Implementation Guidelines," Doc A/112, Apr. 2006, 116 pages.

Graell, et al., "Analysis and Design of Rate Compatible Serial Concatenated Convolution Codes"; IEEE, May 2009, 5 pages.

European Telecomm Standards Institute (ETSI), Radio Broadcasting Systems; Digital Audio Broadcasting (DAB) to Mobile, Portable and Fixed Receivers; ETSI EN 300 401 V1.4.1, Jun. 2006, 202 pages.

Kim, et al., "Non-systematic RS Encoder Design for a Parity Replacer of ATSC-M/H System", IEEE Transactions on Consumer Electronics, vol. 56, No. 3, Aug. 2010, 5 pages.

Bretl, et al., "ATSC RF, Modulation, and Transmission", Proceedings of the IEEE, Vol, 94, No. 1, Jan. 2006, 16 pages.

Bretl, et al., "E-VSB-AN 8-VSB Compatible System with Improved White Noise and Multipath Performance", Consumer Electronics, IEEE Transactions on Consumer Electronics, vol. 47, No. 3, Jun. 2001, 6 pages.

Kim, et al., "Enhanced-xVSB System Development for Mobile/Portable Reception", Consumer Electronics, ICCE, 2005 Digest of Technical Papers, International Conference on, 2 pages.

Hopkins, "Digital Terrestrial HDTV for North America—The Grand Alliance HDTV System," European Broadcasting Union (EBU) Review Technical, XP-000438385, Aug. 1994, 15 pages.

G. Sgrignoli, "Preliminary DTV Field Test Results and Their Effects on VSB Receiver Design", IEEE Transactions on Consumer Electronics, vol. 45, No. 3, Aug. 1999, 22 pages.

Zhang et al., "Future Transmitter/Receiver Diversity Schemes in Broadcast Wireless Networks", IEEE Communications Magazine, Oct. 2006, 8 pages.

Fazel et al., "A Hierarchical Digital HDTV Transmission Scheme for Terrestrial Broadcasting," 1993, 6 pages.

Lee et al., "ATSC-M/H Hardware Multiplexer using Simple Bus Arbitration and Rate Adaptation", IEEE Transactions on Consumer Electronics, vol. 57, No. 3, Sep. 2011, 7 pages.

Kim et al., "Enhanced-xVSB System Development for Mobile/Portable Reception", IEEE Transactions on Consumer Electronics, vol. 51, No. 2, Feb. 2005, 5 pages.

Lambrette, et al., "Variable Sample Rate Digital Feedback NDA Timing Synchronization," Global Telecommunications Conference on Communications: The Key to Global Prosperity, vol. 2, Nov. 1996, 5 pages.

Meyers, et al., "Joint Carrier Phase and Symbol Timing Recovery for PAM Systems," IEEE Transactions on Communications; vol. COM-28, No. 8, Aug. 1980, XP-000758588, 9 pages.

United States Patent and Trademark Office U.S. Appl. No. 13/490,401, First Action Interview Pilot Program Pre-Interview Communication dated Mar. 22, 2013, 2 pages.

United States Patent and Trademark Office U.S. Appl. No. 13/442,810, Notice of Allowance dated May 10, 2013, 12 pages.

United States Patent and Trademark Office U.S. Appl. No. 12/961,794, First Action Interview Pilot Program Pre-Interview Communication dated Apr. 21, 2013, 2 pages.

Korean Intellectual Property Office Application Serial No. 10-2006-0108038, Notice of Allowance dated Apr. 17, 2013, 2 pages.

Korean Intellectual Property Office Application Serial No. 10-2007-0029485, Notice of Allowance dated Jun. 26, 2013, 2 pages.

Korean Intellectual Property Office Serial No. 10-2007-0031960, Notice of Allowance dated Jun. 26, 2013, 2 pages.

United States Patent and Trademark Office U.S. Appl. No. 13/490,401, First Action Interview Pilot Program Pre-Interview Communication dated Jun. 26, 2013, 6 pages.

* cited by examiner

DTV TRANSMITTING SYSTEM AND METHOD OF PROCESSING BROADCAST DATA

CROSS-REFERENCE TO RELATED APPLICATIONS

This application is a continuation of U.S. patent application Ser. No. 14/861,504 filed Sep. 22, 2015, now allowed, which is a continuation of U.S. patent application Ser. No. 14/607,640, filed Jan. 28, 2015, now allowed, which is a continuation of U.S. patent application Ser. No. 14/181,461, filed on Feb. 14, 2014, now U.S. Pat. No. 8,984,381, issued on Mar. 17, 2015 which is a continuation of U.S. patent application Ser. No. 13/850,163, filed on Mar. 25, 2013, now U.S. Pat. No. 8,689,086, issued on Apr. 1, 2014, which is a continuation of U.S. patent application Ser. No. 12/717,111, filed on Mar. 30, 2010, now U.S. Pat. No. 8,429,504, issued on Apr. 23, 2013, which is a continuation of U.S. application Ser. No. 11/741,102, filed on Apr. 27, 2007, now U.S. Pat. No. 7,739,581, issued on Jun. 15, 2010, which claims the benefit of earlier filing date and right of priority to Korean Patent Application No. 10-2006-0039118, filed on Apr. 29, 2006, and Korean Patent Application No. 10-2006-0089736, filed on Sep. 15, 2006, and also claims the benefit of U.S. Provisional Application No. 60/821,251, filed on Aug. 2, 2006, the contents of which are all hereby incorporated by reference herein in their entirety.

BACKGROUND OF THE INVENTION

Field of the Invention

The present invention relates to television systems and methods of processing broadcast data.

Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receiving systems.

SUMMARY OF THE INVENTION

Accordingly, the present invention is directed to a DTV transmitting system and a method of processing broadcast data that substantially obviate one or more problems due to limitations and disadvantages of the related art.

The present invention is to provide a DTV transmitting system and a method of processing broadcast that is suitable for transmitting additional data and that is highly resistant to noise.

The present invention is to provide a DTV transmitting system and a method of processing broadcast that can perform additional encoding on enhanced data and transmit the additionally encoded enhanced data, thereby enhancing the receiving quality of the receiving system.

The present invention is to provide a DTV transmitting system and a method of processing broadcast that can multiplex the known data and enhanced data, thereby enhancing the receiving quality of the receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitting system includes an encoder, a randomizer, a block processor, a group formatter, a deinterleaver, and a packet formatter. The encoder codes enhanced data for error correction, permutes the coded enhanced data, and further codes the permuted enhanced data for error detection. The randomizer randomizes the enhanced data coded for error detection, and the block processor codes the randomized enhanced data at an effective coding rate of 1/H. The group formatter forms a group of enhanced data having one or more data regions, and inserts the enhanced data coded at the effective coding rate of 1/H into at least one of the data regions. The deinterleaver deinterleaves the group of enhanced data, and the packet formatter formats the deinterleaved enhanced data into enhanced data packets.

In another aspect of the present invention, a digital television (DTV) transmitting system includes an encoder, a data randomizing and expanding unit, a group formatter, a block processor, a deinterleaver, and a packet formatter. The encoder codes enhanced data for error correction, permutes the coded enhanced data, and further codes the permuted enhanced data for error detection. The data randomizing and expanding unit randomizes the enhanced data coded for error detection and expands the randomized enhanced data at an expansion rate of 1/H. The group formatter forms a group of enhanced data having one or more data regions, and inserts the expanded enhanced data into at least one of the data regions. The block processor codes the enhanced data in the group of enhanced data at a coding rate of 1/H. The deinterleaver deinterleaves the enhanced data coded with the coding rate of 1/H, and the packet formatter formats the interleaved enhanced data into enhanced data packets.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
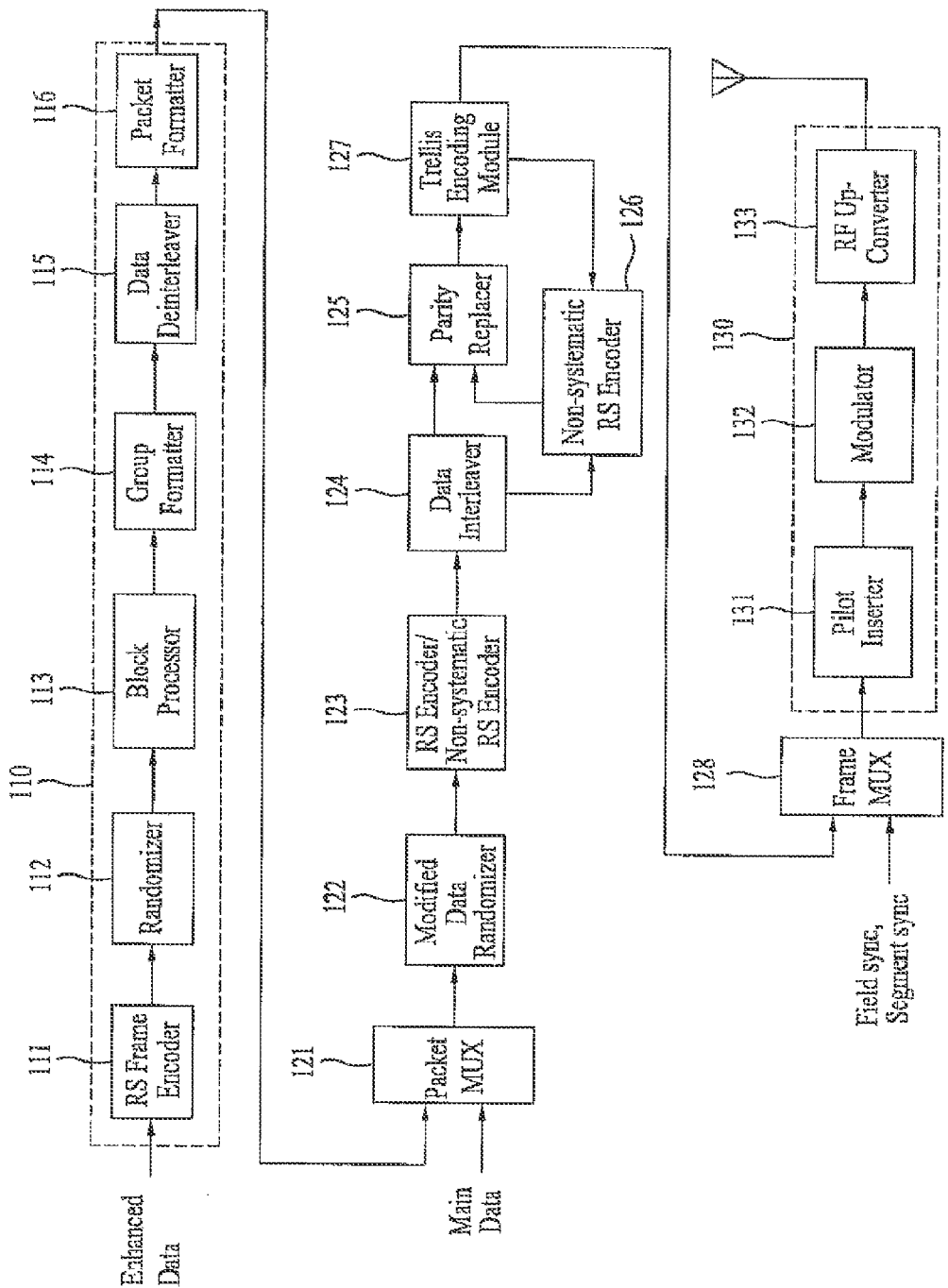
FIG. 1 illustrates a block diagram showing a structure of a digital broadcast (or television or DTV) transmitting system according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. Within the drawings, the same reference numerals will be used for identical elements in different drawings. Accordingly, a detailed description of such identical elements will be omitted for simplicity. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, and so on, or consist of video/audio data. Additionally, the known data refer to data already known based upon a pre-determined agreement between the transmitting system and the receiving system. Furthermore, the main data consist of data that can be received from the conventional receiving system, wherein the main data include video/audio data. The present invention relates to performing additional encoding on the enhanced data, then, multiplexing the additionally encoded enhanced data with the main data and outputting the multiplexed data, so as to provide robustness to the enhanced data, thereby enabling the data to take strong countermeasures against the constantly changing channel environment. The encoding process will be described according to first and second embodiments of the present invention.

First Embodiment

FIG. 1 illustrates a block diagram showing a structure of a digital television transmitting system according to a first embodiment of the present invention. Referring to FIG. 1, the digital television transmitting system includes a pre-processor 110, a packet multiplexer 121, a data randomizer 122, a Reed-Solomon (RS) encoder/non-systematic RS encoder 123, a data interleaver 124, a parity replacer 125, a non-systematic RS encoder 126, a trellis encoding module 127, a frame multiplexer 128, and a transmitting unit 130. The pre-processor 110 includes a RS frame encoder 111, an enhanced data randomizer 112, a block processor 113, a group formatter 114, a data deinterleaver 115, and a packet formatter 116.

In the present invention having the above-described structure, the main data is inputted to the packet multiplexer 121, and the enhanced data is putted to the pre-processor 110 which performs additional encoding, so that the enhanced data can take strong countermeasures against noise and the constantly changing channel environment. The RS frame encoder 111 of the pre-processor 110 receives the enhanced data and configures the frame in order to perform the additional encoding. Thereafter, the RS frame encoder 111 performs the additional encoding on the enhanced data and, then, outputs the additionally encoded enhanced data to the enhanced data randomizer 112.

For example, the RS frame encoder 111 performs at least any one of an error correction encoding process and an error detection encoding process on the inputted enhanced data so as to provide the data with robustness. In addition, the RS frame encoder 111 may also perform a process of permuting various sets of enhanced data having a predetermined size by dispersing burst errors that may occur due to a change in the frequency environment, thereby enabling the enhanced data to take countermeasures against a severely poor and constantly and abruptly changing frequency environment.

According to another environment of the present invention, the RS frame encoder 111 performs error correction encoding on the inputted enhanced data, so as to add data required for error correction. Then, the RS frame encoder 111 performs a row permutation process for permuting data row by row. Subsequently, the RS frame encoder 111 performs the error detection encoding, thereby adding data required for error detection. At this point, as an example of the present invention, RS-coding is applied for the error correction encoding process, and a cyclic redundancy check (CRC) encoding is applied for the error detection process. When performing the RS-coding, parity data that are used for the error correction are generated. And, when performing the CRC encoding, CRC data that are used for the error detection are generated.

More specifically, the RS frame encoder 111 identifies (or distinguishes) the inputted enhanced data by units of a predetermined length (A). A plurality of units of the identified predetermined length (A) is grouped to form a RS frame. Thereafter, RS-coding is performed on the newly formed RS frame along the direction of the row or column. In the present invention, the predetermined length (A) will be referred to as a row for simplicity of the description. Herein, the value A is decided by the system designer.

For example, if the inputted enhanced data correspond to an MPEG transport stream (TS) packet configured in 188-byte units, the first MPEG synchronization byte is removed. Thereafter, a row (A) is formed on the 187 bytes. Herein, the MPEG synchronization byte is removed so that all enhanced data packets are given the same value. If the inputted enhanced data do not include a removable byte, or if the inputted enhanced data packet is not 187-byte long, the inputted data are divided into units of 187 bytes, so that each 187-byte data unit configures a row. A plurality of rows configured according to the above 0 described process is grouped to form a RS frame.

In the present invention, RS-coding is performed by RS frame units, thereby adding parity bytes thereto. Thereafter, a row permutation process is performed on the parity-byte-added RS frame. For example, a plurality (or G number) of RS frames that are RS-coded is grouped to form a group. More specifically, after performing the row permutation process, the $i^{th}$ row of the RS frame group prior to the row permutation process, is placed to the $j^{th}$ row of the RS frame group after the row permutation process. The relation between i and j is shown in Equation 1 below.

$$j = G(i \bmod S) + [i/S]$$

$$i = S(j \bmod G) + [j/G] \quad \text{[Equation 1]}$$

where $0 \leq i, j < SG$

Herein, G represents the number of RS frames included in the RS frame group, and S represents the value of the number of rows within the RS frame prior to the RS-coding added with the parities generated by the RS-coding process. After the row permutation process is performed, CRC encoding is performed on the row-permuted data so as to add a CRC checksum. The CRC checksum indicates whether the enhanced data have been damaged by an error while being transmitted through a channel. The present invention may also use other error detection encoding methods other than the CRC encoding. Alternatively, the present invention may also use the error correction encoding method so as to enhance the overall error correcting ability (or function) of the DTV receiving system.

As described above, the CRC encoded data are outputted to the enhanced data randomizer 112. Herein, the enhanced data randomizer 112 receives and randomizes the enhanced data in which robustness has been enhanced due to the encoding and row permutation. Thereafter, the randomized enhanced data are outputted to the block processor 113. At this point, by randomizing the enhanced data in the enhanced data randomizer 112, the process of randomizing the enhanced data at the randomizer 122 in a later process may be omitted. The randomizer identical to that of the conventional ATSC or other types of randomizer may be used for randomizing the enhanced data. More specifically, a pseudo random byte generated from within the inputted 187-byte enhanced data may be used to randomize the enhanced data. The block processor 113 codes the randomized enhanced data at a G/H coding rate and outputs the coded enhanced data. For example, if 1 bit of enhanced data is coded to 2 bits and outputted, then G is equal to 1 and H is equal to 2 (i.e., G=1 and H=2). Alternatively, if 1 bit of enhanced data is coded to 4 bits and outputted, then G is equal to 1 and H is equal to 4 (i.e., G=1 and H=4).

Figure 2:
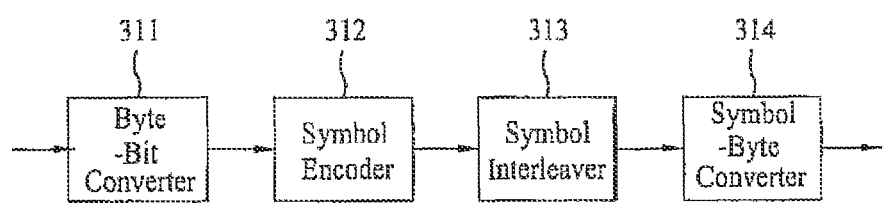
FIG. 2 and FIG. 3 illustrate block diagrams of a block processor shown in FIG. 1.
Figure 3:
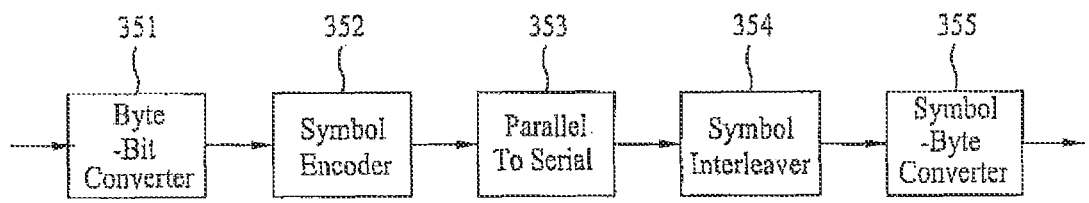

FIG. 2 and FIG. 3 illustrate block diagrams showing examples of the block processor 113. Referring to FIG. 2, the block processor 113 includes a byte-bit converter 311, a symbol encoder 312, a symbol interleaver 313, and a symbol-byte converter 314, and the block processor 113 may perform a coding process at a 1/2-coding rate or a 1/4-coding rate. More specifically, the byte-bit converter 311 identifies the inputted enhanced data byte by 1-bit units and outputs the identified enhanced data bits to the symbol encoder 312. The symbol encoder 312 codes the inputted enhanced data bit to a 2-bit symbol and outputs the coded 2-bit symbol to the symbol interleaver 313. In this case, the symbol encoder 312 is operated as an encoder having a 1/2-coding rate.

Meanwhile, if the symbol encoder 312 is to be operated as an encoder having a 1/4-coding rate, the symbol coded at a 1/2-coding rate may be repeated so as to output two symbols, or the input data bit may be coded at a 1/2-coding rate two times and outputted as two symbols. The above-mentioned 1/2-coding rate and 1/4-coding rate are only exemplary embodiments proposed in the description of the present invention, and the coding rate may vary depending upon the number of repetition. Therefore, the present invention is not limited only to the examples proposed herein. The symbol interleaver 313 receives the output symbol of the symbol encoder 312 in symbol units so as to perform a block interleaving process on the received symbol, thereby outputting the processed symbol to the symbol-byte converter 314. The symbol-byte converter 314 converts the output symbols of the symbol interleaver to byte units, thereby outputting the byte-converted symbol to the group formatter 114.

Referring to FIG. 3, the block processor 113 includes a byte-bit converter 351, a symbol encoder 352, a parallel-to-serial converter 353, a symbol interleaver 354, and a symbol-byte converter 355, and the block processor 113 may perform a coding process at a 1/2-coding rate or a 1/4-coding rate. More specifically, the byte-bit converter 351 identifies (or distinguishes) the inputted enhanced data byte by 1-bit units and, then, outputs the identified bits to the symbol encoder 352. The symbol encoder 352 codes the inputted enhanced data bits to 4 bits, i.e., to two symbols, and simultaneously outputs the coded enhanced data bits to the parallel-to-serial converter 353. In this case, the symbol encoder 352 operates as an encoder having a 1/4-coding rate. The parallel-to-serial converter 353 converts the two symbols inputted in parallel to serial symbol units, thereby serially (or sequentially) outputting the two symbols to the symbol interleaver 354.

Meanwhile, if one of the two symbols coded in the symbol encoder 352 is selected and outputted, the symbol encoder 352 is operated as a 1/2-coding rate encoder. Since the output is in symbol units, the output symbol bypasses the parallel-to-serial converter 353 and is inputted to the symbol interleaver 354. In addition, if the symbol encoder 312 repeatedly outputs two 1/2-rate coded symbols, or if the symbol encoder 312 coded an input bit twice at a 1/2-coding rate, the overall coding rate becomes a 1/4-coding rate, thereby enhancing the error correction ability (or function). However, the size of the actual data that can be transmitted becomes smaller as the coding rate becomes lower. Therefore, the coding rate should be decided while taking these two factors into consideration.

The above-mentioned 1/2-coding rate and 1/4-coding rate are only exemplary embodiments proposed in the description of the present invention, and the coding rate may vary depending upon either the selection of the coded symbols or the number of repetition. Therefore, the present invention is not limited only to the examples proposed herein. By performing symbol-unit block interleaving, the symbol interleaver 354 rearranges the order of the symbols outputted from the parallel-to-serial converter 353 and outputs the rearranged symbols to the symbol-byte converter 355. The symbol-byte converter 355 converts the symbols outputted from the symbol interleaver 354 to byte units and outputs the byte-converted symbols to the group formatter 114.

Figure 4:
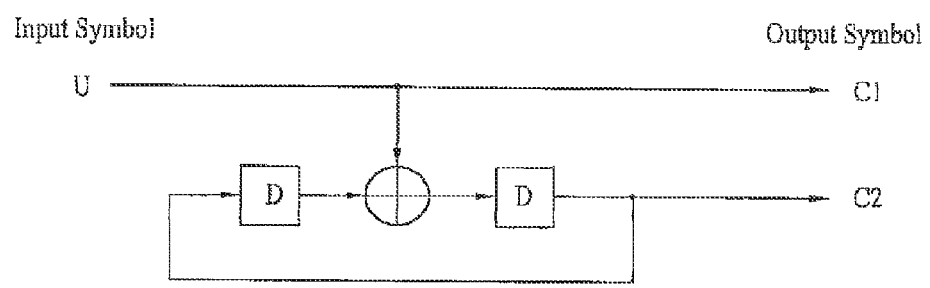
FIG. 4 and FIG. 5 illustrate block diagrams of a symbol encoder according to the present invention.
Figure 5:
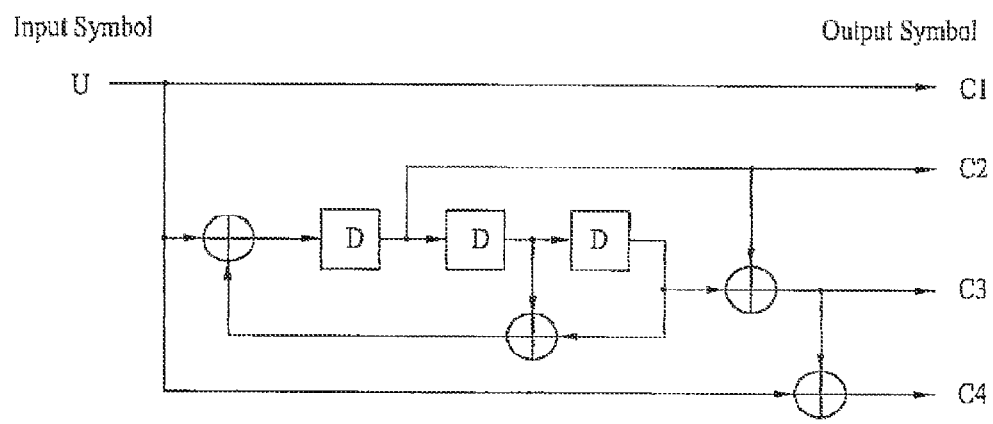

FIG. 4 and FIG. 5 respectively illustrate block diagrams of the symbol encoder according to the embodiments of the present invention shown in FIGS. 2 and 3. The symbol encoder shown in FIG. 4 includes two memories, one adder, and four memory states (i.e., 00, 01, 10, and 11). Referring to FIG. 4, the symbol encoder codes and outputs an inputted enhanced data bit U to two bits C1 and C2. Herein, the enhanced data bit U is outputted as an upper output bit C1 and simultaneously coded and outputted as a lower output bit C2 as well. Therefore, the symbol encoder of FIG. 4 may be operated as a 1/2-coding rate encoder. If the symbol encoder of FIG. 4 is to be used as a 1/4-coding rate encoder, the enhanced data bit U is coded to generate output bits C1C2. Then, the output bits C1 C2 are repeated so as to generate final output bits C1C2C1C2. As another example, the enhanced data bit U is coded two times at a 1/2-coding rate, thereby outputting final output bits of C1C2C1C2.

Alternatively, the symbol encoder of FIG. 5 includes three memories and four adders. Therefore, it is apparent that, in FIG. 5, the symbol encoder codes and outputs an inputted enhanced data bit U to four bits C1 to C4. Herein, the enhanced data bit U is outputted as the most significant (or uppermost) output bit C1 and simultaneously coded and outputted as lower output bits C2C3C4 as well. Therefore, the symbol encoder of FIG. 5 may be operated as a 1/4-coding rate encoder. If the symbol encoder of FIG. 5 is to be used as a 1/2-coding rate encoder, the enhanced data bit U is coded to generate output bits C1C2C3C4. Then, only two bits (i.e., one symbol) of output bits C1C2C3C4 are selected and outputted.

The group formatter 114 creates a data group in accordance with a pre-defined rule. Thereafter, the group formatter 113 inserts the inputted enhanced data to the corresponding areas within the created data group. At this point, the data group may be described as at least one layered area. Herein, the type of enhanced data allocated to each area may vary depending upon the characteristics of each layered area.

Figure 6:
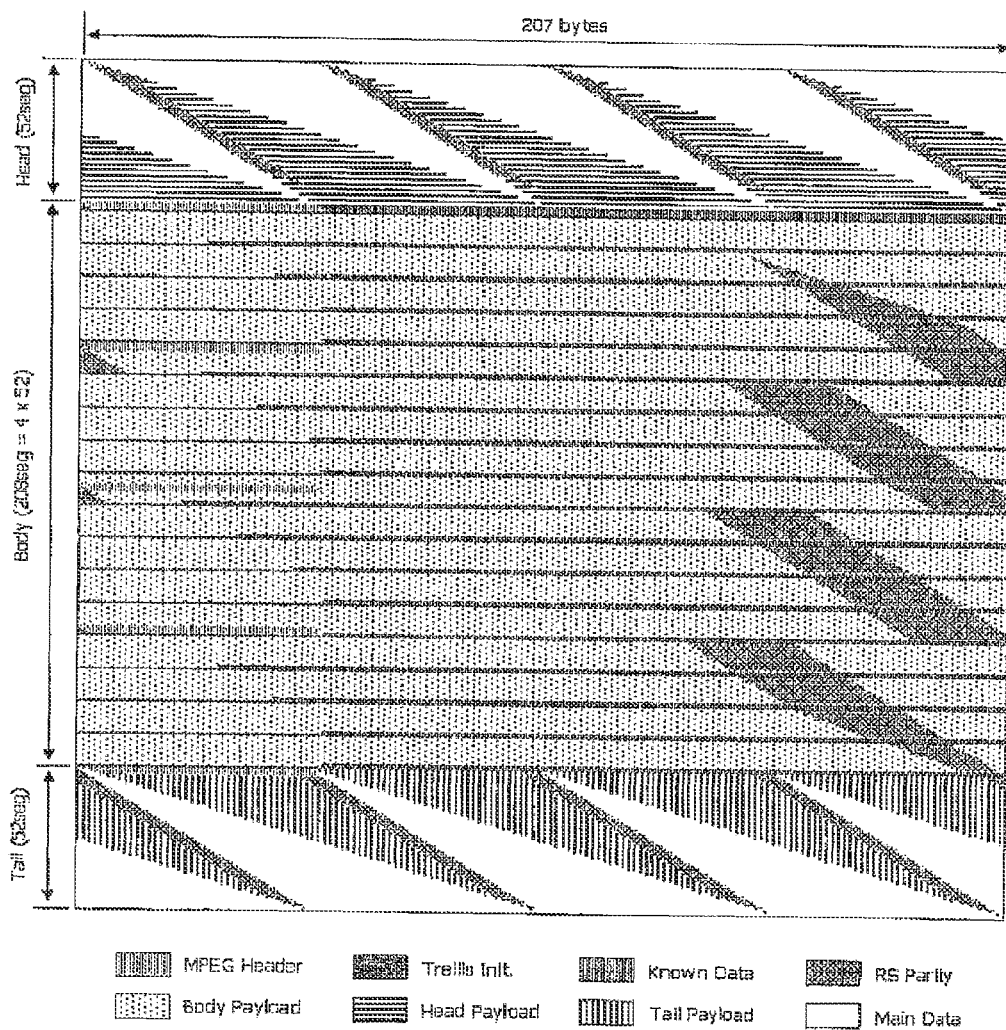
FIG. 6 and FIG. 7 illustrate examples of a data structure at the before and after ends of a data deinterleaver in a digital television transmitting system according to the present invention.
Figure 7:
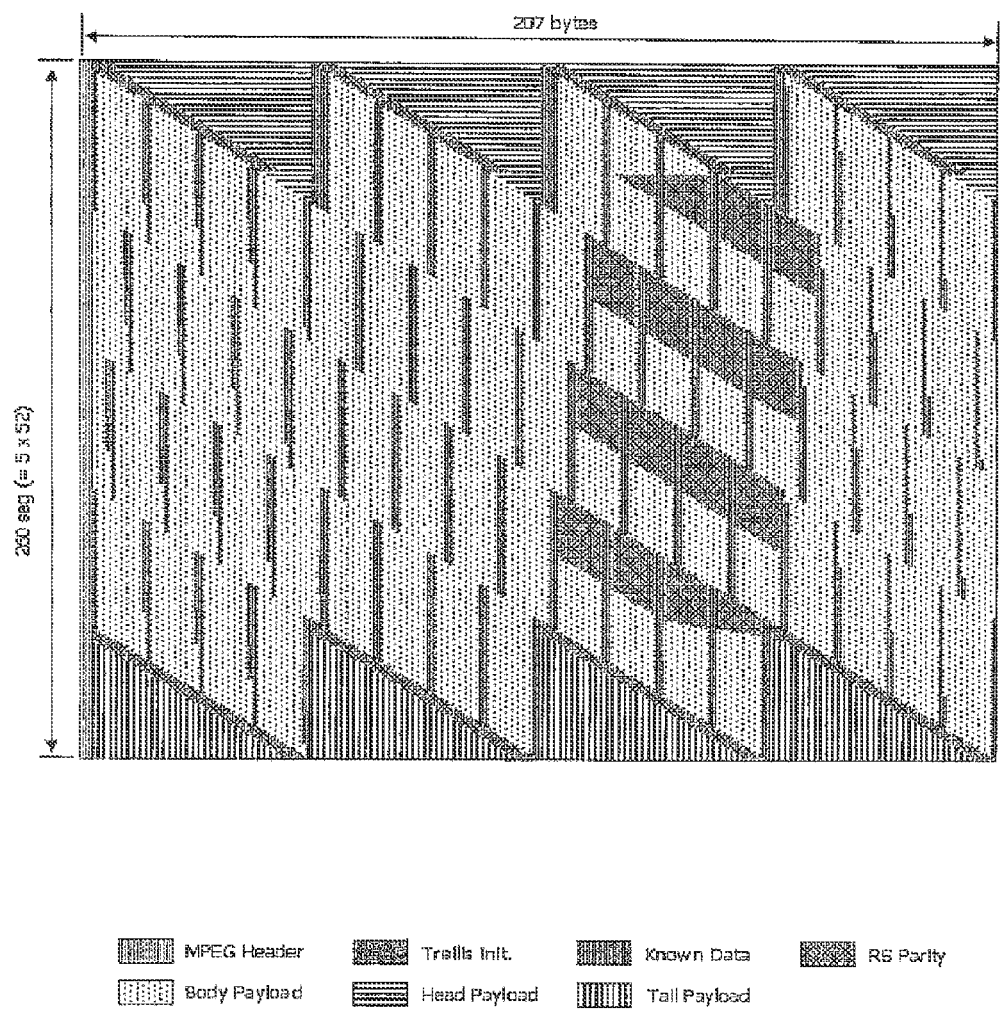

FIG. 6 illustrates an alignment of different data sets prior to the data deinterleaving, and FIG. 7 illustrates an alignment of different data sets after the data deinterleaving. In other words, FIG. 6 corresponds to the data structure after being data interleaved, and FIG. 7 corresponds to the data structure before being data interleaved. FIG. 6 illustrates an example of a data group within a data structure prior to the data deinterleaving, the data group being divided into three layered areas: a head area, a body area, and a tail area. Accordingly, in the data group that is data interleaved and outputted, the head area is first outputted, then the body area is outputted, and the tail area is outputted last.

FIG. 6 and FIG. 7 each show an example of 260 packets configuring the data group. Herein, since the data interleaver operates periodically in units of 52 packets, a 52*5n number of packets (wherein, n is an integer) configure the data group. In addition, referring to the data group being inputted to the data deinterleaver, FIG. 6 illustrates an example of the head, body, and tail areas of the data group being configured so that the body area is entirely formed of the enhanced data and is not mixed with the main data. At this point, the body area of the data group being inputted to the data deinterleaver may be allocated so that the body area includes either at least a portion or the entire portion of an area within the data group having the enhanced data continuously outputted therefrom. Herein, the body area may also include an area having the enhanced data outputted non-continuously.

The data group is divided into three areas so that each area may be used differently. More specifically, referring to FIGS. 6 and 7, the area corresponding to the body is configured only of enhanced data and is not interfered by any main data, thereby showing a highly resistant receiving quality. On the other hand, in each of the areas corresponding to the head and the tail, the enhanced data set is alternately mixed with the main data sets due to the output order of the interleaver. Thus, the receiving quality of the head and tail areas is relatively poorer than that of the body area.

Furthermore, when using a system inserting and transmitting the known data to the data group, and when a long and continuous set of known data is to be inserted periodically in the enhanced data, the known data may be inserted in an area in which the enhanced data are not mixed with the main data based upon the output order from the data interleaver. More specifically, in the body area of FIGS. 6 and 7, a predetermined length of known data may be periodically inserted in the body area. However, it is difficult to periodically insert the known data in the head area and the tail area, and it is also difficult to insert a long and continuous set of known data. Therefore, the group formatter 114 inserts the enhanced data inserted in the corresponding area within the above-described data group.

For example, the group formatter 114 allocates the received enhanced data to the body area. And, apart from the enhanced data, the group formatter 114 also separately allocates signaling information indicating the overall transmission information to the body area. In other words, the signaling information corresponds to information required by the receiving system for receiving and processing the data included data group. Herein, the signaling information includes data group information, multiplexing information, and so on. Furthermore, as shown in FIG. 6, the group formatter 114 also inserts an MPEG header place holder, a non-systematic RS parity place holder, and a main data place holder in relation with the data deinterleaving. Referring to FIG. 6, the main data place is allocated because the enhanced data and the main data are alternately mixed in the head and tail areas based upon the input of the data deinterleaver. In the output data that have been data deinterleaved, the place holder for the MPEG header is allocated to the very beginning of each packet.

The group formatter 114 either inserts the known data generated by a pre-decided method in a corresponding area, or inserts a known data place holder in a corresponding area so as to insert the known data in a later process. Moreover, a place holder for initializing the trellis encoder 145 is inserted in the corresponding area. For example, the initialization data place holder may be inserted in front of the known data sequence. The data group having either the data or the place holder inserted therein by the group formatter 114 is inputted to the data deinterleaver 115. Referring to FIG. 6, whenever required in a later process, the head and tail areas may be used for the enhanced data or other information data or data used for supporting the enhanced data.

The data deinterleaver 115 performs an inverse process of the data interleaver on the inputted data group and, then, outputs the deinterleaved data group to the packet formatter 116. More specifically, when the data group having the format shown in FIG. 6 is inputted to the data deinterleaver 115, the data group is deinterleaved, as shown in FIG. 7, and outputted to the packet formatter 116. Herein, only the portions corresponding to the data group are shown in FIG. 7. Among the deinterleaved and inputted data, the packet formatter 116 removes the main data place holder and the RS parity place holder that have been allocated for the deinterleaving process. Then, the packet formatter 116 gathers (or groups) the remaining portion of the input data and inserts the remaining data to the 4-byte MPEG header place holder in place of the MPEG header. Furthermore, when the known data place holder is inserted by the group formatter 114, the packet formatter 116 known data may be inserted in place of the known data place holder. Alternatively, the known data place holder may be directly outputted without any modification for the replacement insertion in a later process.

Thereafter, the packet formatter 116 configures the data within the data group packet that is formatted as described above, as a 188-byte unit MPEG TS packet. Then, the packet formatter 116 provides the configured 188-byte unit MPEG TS packet to the packet multiplexer 121. The packet multiplexer 121 multiplexes the 188-byte enhanced data packet and the main data packet outputted from the packet formatter 116 according to a pre-defined multiplexing method. Then, the multiplexed packets are outputted to the data randomizer 122. The multiplexing method may be altered or modified by various factors in the design of the system.

In a multiplexing method of the packet multiplexer 121, an enhanced data burst section and a main data section are distinguished (or identified) along a time axis, then the two sections are set to be repeated alternately. At this point, in the enhanced data burst section, at least one of the data groups may be transmitted, and only the main data may be transmitted in the main data section. In the enhanced data burst section, the main data may also be transmitted. When the enhanced data are transmitted in the above-described burst structure, the DTV receiving system receiving only the enhanced data may turn on the power only during the enhanced data burst section. Alternatively, in the main data section whereby only the main data are transmitted, the power is turned off during the main data section, thereby preventing the main data from being received. Thus, excessive power consumption of the DTV receiving system may be reduced or prevented. As described above, the packet multiplexer 121 receives the main data packet and the enhanced data packet, which is outputted from the packet formatter, and transmits the received packets in a burst structure.

When the inputted data correspond to the main data packet, the data randomizer 122 performs a randomizing process identical to that of the conventional randomizer. More specifically, the MPEG synchronization byte within the main data packet is discarded (or deleted). Then, the remaining 187 bytes are randomized by using a pseudo random byte generated from within the data randomizer 122. Subsequently, the randomized data bytes are outputted to the RS encoder/non-systematic RS encoder 123.

However, when the inputted data correspond to the enhanced data packet, the MPEG synchronization byte among the four bytes included in the enhanced data packet is discarded (or deleted) and only the remaining 3 bytes are randomized. The remaining portion of the enhanced data excluding the MPEG header is not randomized and outputted directly to the RS encoder/non-systematic RS encoder 123. This is because a randomizing process has already been performed on the enhanced data in the enhanced data randomizer 112. The RS encoder/non-systematic RS encoder 123 RS-codes the data randomized by the data randomizer 122 or the data bypassing the data randomizer 122. Then, the RS encoder/non-systematic RS encoder 123 adds a 20-byte RS parity to the coded data, thereby outputting the RS-parity-added data to the data interleaver 124.

At this point, if the inputted data correspond to the main data packet, the RS encoder/non-systematic RS encoder 123 performs a systematic RS-coding process identical to that of the conventional broadcast system on the inputted data, thereby adding the 20-byte RS parity at the end of the 187-byte data. Alternatively, if the inputted data correspond to the enhanced data packet, each place of the 20 parity bytes is decided within the packet. Thereafter, the 20 bytes of RS parity gained by performing the non-systematic RS-coding are respectively inserted in the decided parity byte places. Herein, the data interleaver 124 corresponds to a byte unit convolutional interleaver. The output of the data interleaver 124 is inputted to the parity replacer 125 and the non-systematic RS encoder 126.

Meanwhile, a memory within the trellis encoding module 127 should first be initialized in order to allow the output data of the trellis encoding module 127, which is positioned after the parity replacer 125, to become the known data defined based upon an agreement between the receiving system and the transmitting system. More specifically, the memory of the trellis encoding module 127 should first be initialized before the known data sequence being inputted is encoded. At this point, the beginning of the known data sequence that is inputted corresponds to the initialization data place holder included by the group formatter 114 and not the actual known data. Therefore, a process of generating initialization data right before the trellis-encoding of the known data sequence being inputted and a process of replacing the initialization data place holder of the corresponding trellis encoder memory with the newly generated initialization data are required. This is to ensure the backward-compatibility with the conventional receiving system.

Additionally, the value of the trellis memory initialization data is decided in accordance with a previous state of the memory in the trellis encoding module 127, and the initialization data are generated accordingly. Furthermore, due to the replaced initialization data, a process of recalculating the RS parity and a process of replacing the newly calculated RS parity with the RS parity outputted from the data interleaver 124 are required. Therefore, the non-systematic RS encoder 126 receives the enhanced data packet including the initialization data place holder that is to be replaced with the initialization data from the data interleaver, and the non-systematic RS encoder 126 receives the initialization data from the trellis encoding module 127. Then, the non-systematic RS encoder 126 calculates a new non-systematic RS parity and outputs the newly calculated non-systematic RS parity to the parity replacer 125. Thereafter, the parity replacer 125 selects the output of the data interleaver 124 as the data within the enhanced data packet, and the parity replacer 125 selects the output of the non-systematic RS encoder 126 as the RS parity.

Meanwhile, when the main data packet is inputted or when the enhanced data packet, which does not include the initialization data place holder that is to be replaced, is inputted, the parity replacer 125 selects the data outputted from the data interleaver 124 and the RS parity and outputs the selects output data and RS parity to the trellis encoding module 127 without any modification. The trellis encoding module 127 modifies the byte-unit data to symbol-unit data. Then, the trellis encoding module 127 12-way interleaves and trellis-encodes the modified data, so as to output the processed data to the frame multiplexer 128. The frame multiplexer 128 inserts field and segment synchronization signals in the output of the trellis encoding module 127 and outputs the processed data to the transmitting unit 130. Herein, the transmitting unit 130 includes a pilot inserter 131, a modulator 132, and a radio frequency (RF) up-converter 133. The transmitting unit 130 operates identically as in the conventional transmitting system. Therefore, a detailed description of the same will be omitted for simplicity.

Second Embodiment

Figure 8:
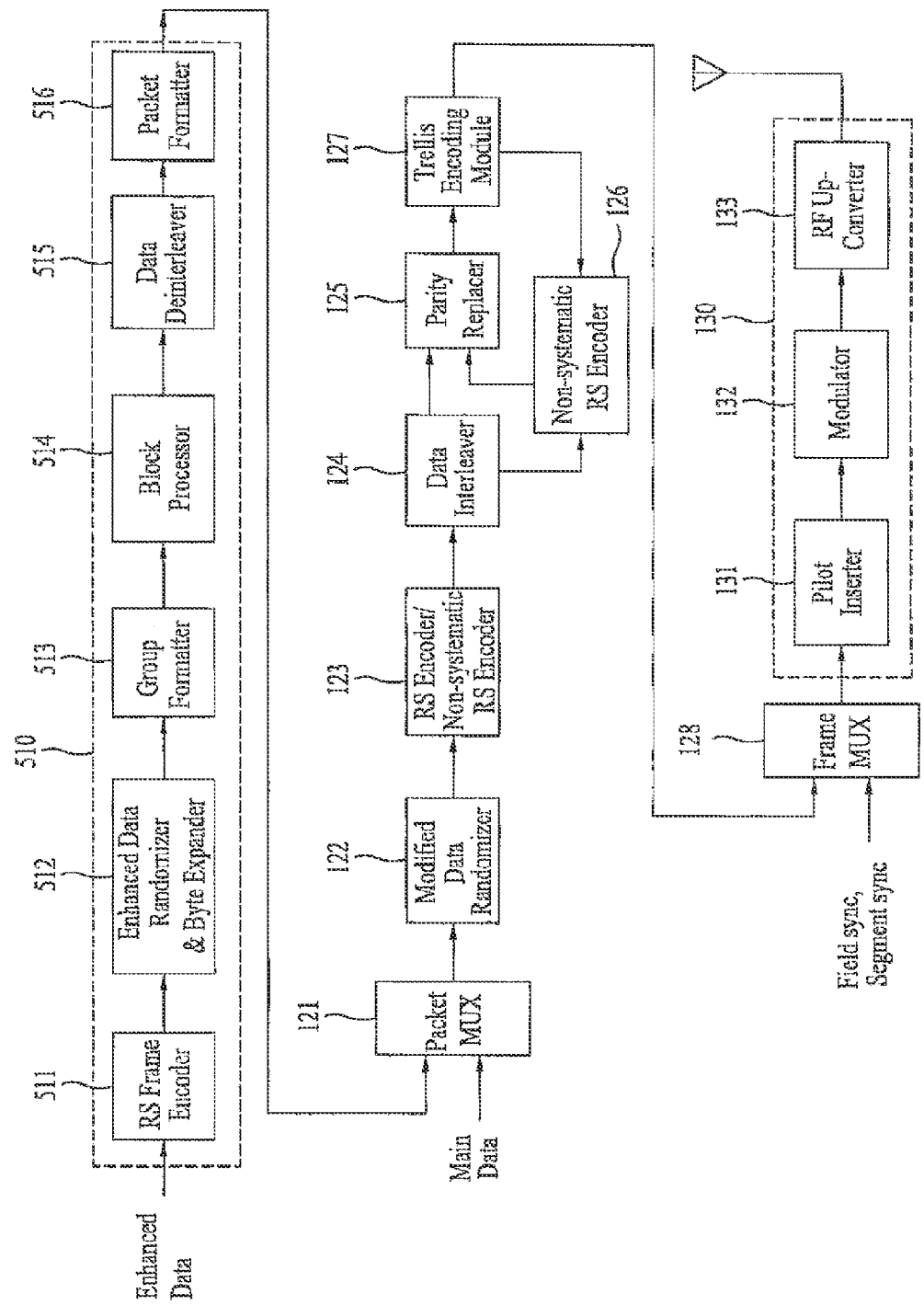
FIG. 8 illustrates a block diagram showing a structure of a digital broadcast (or television or DTV) transmitting system according to another embodiment of the present invention.

FIG. 8 illustrates a block diagram showing a structure of a digital television transmitting system according to a second embodiment of the present invention. Referring to FIG. 5, the digital television transmitting system includes a pre-processor 510, a packet multiplexer 121, a data randomizer 122, a Reed-Solomon (RS) encoder/non-systematic RS encoder 123, a data interleaver 124, a parity replacer 125, a non-systematic RS encoder 126, a trellis encoding module 127, a frame multiplexer 128, and a transmitting unit 130. The pre-processor 510 includes a RS frame encoder 511, a randomizer/byte expander 512, a group formatter 513, a block processor 514, a data deinterleaver 515, and a packet formatter 516.

The difference between the digital television transmitting system shown in FIG. 1 and the digital television transmitting system shown in FIG. 8 is the arrangement order of the group formatter and the block processor. In FIG. 1, the group formatter 114 is placed after the block processor 113, whereas the block processor 514 is placed after the group formatter 513. More specifically, in the digital television transmitting system shown in FIG. 5, since the group formatter 513 is placed before the block processor 514, for a smooth operation of the group formatter 513, a byte expansion process is required to be performed before the operation of the group formatter 513 so that the group formatter 513 may correspond with the coding process of the block processor 514. Therefore, in the digital television transmitting system shown in FIG. 5, the randomizer/byte expander 512 not only performs a randomizing process but also performs a byte expansion process by inserting null data bytes.

Conversely, in the digital television transmitting system shown in FIG. 1, the block processor 113 is placed before the group formatter 114. Accordingly, since expansion is performed by the coding process of the block processor 113, a separate byte expansion process is not necessary. Therefore, in FIG. 1, only a randomizing process is performed on the enhanced data and a byte expansion process is not performed. Hereinafter, the pre-processor 510 will be described in detail with reference to FIG. 5. Since the other blocks (i.e., reference numerals 121 to 128 and 130) may be applied identically as those of FIG. 1, the detailed description of the same will be omitted for simplicity.

The enhanced data are inputted to the pre-processor 510 which performs additional encoding, so that the enhanced data can take strong countermeasures against noise and the constantly changing channel environment. The RS frame encoder 511 of the pre-processor 510 receives the enhanced data and configures the frame in order to perform the additional encoding. Thereafter, the RS frame encoder 511 performs the additional encoding on the enhanced data and, then, outputs the additionally encoded enhanced data to the randomizer/byte expander 512.

The RS frame encoder 511 performs at least any one of an error correction encoding process and an error detection encoding process on the inputted enhanced data so as to provide the data with robustness. In addition, the RS frame encoder 511 may also perform a process of permuting various sets of enhanced data having a predetermined size by dispersing burst errors that may occur due to a change in the frequency environment, thereby enabling the enhanced data to take countermeasures against a severely poor and constantly and abruptly changing frequency environment.

As an example, the RS frame encoder 511 performs error correction encoding on the inputted enhanced data, so as to add data required for error correction. Then, the RS frame encoder 511 performs a row permutation process for permuting data row by row. Subsequently, the RS frame encoder 511 performs the error detection encoding, thereby adding data required for error detection. At this point, as an example of the present invention, RS-coding is applied for the error correction encoding process, and a cyclic redundancy check (CRC) encoding is applied for the error detection process. When performing the RS-coding, parity data that are used for the error correction are generated and added. And, when performing the CRC encoding, CRC data that are used for the error detection are generated and added. Each of the RS-coding, row permutation, and CRC encoding processes are identical to those mentioned in FIG. 1, and therefore, a detailed description of the same will be omitted for simplicity.

The randomizer/byte expander 512 receives and randomizes the enhanced data in which robustness has been enhanced due to the encoding and row permutation. Herein, a byte expansion process is also performed on the enhanced data by inserting null data bytes. At this point, by randomizing the enhanced data in the randomizer/byte expander 512, the process of randomizing the enhanced data at the randomizer 122 in a later process may be omitted. The randomizer identical to that of the conventional ATSC or other types of randomizer may be used for randomizing the enhanced data. More specifically, a pseudo random byte generated from within the inputted 187-byte enhanced data may be used to randomize the enhanced data.

Additionally, the order of the randomizing process and the byte expansion process may be altered. In other words, the randomizing process may first be performed as described above, which is then followed by the byte expansion process. Alternatively, the byte expansion process may first be performed, which is then followed by the randomizing process. The order of the processes may be selected in accordance with the overall structure of the system.

The byte expansion process may vary depending upon the coding rate of the block processor 514. More specifically, if the coding rate of the block processor 514 corresponds to a G/H coding rate, then the byte expander expands G bytes to H bytes. For example, if the coding rate corresponds to 1/2 coding rate, then 1 byte is expanded to 2 bytes. And, if the coding rate is 1/4, then 1 byte is expanded to 4 bytes. The enhanced data outputted from the randomizer/byte expander 512 are inputted to the group formatter 513. The group formatter 513 creates a data group, as shown in FIG. 1, and then inserts the inputted enhanced data to the corresponding areas within the created data group. At this point, the data group may be described as at least one layered area. Herein, the type of enhanced data allocated to each area may vary depending upon the characteristics of each layered area.

In the present invention, the data group is divided into three layered areas: a head area, a body area, and a tail area. More specifically, in the data group that is data interleaved and outputted, the head area is first outputted, then the body area is outputted, and the tail area is outputted last. At this point, the body area of the data group being inputted to the data deinterleaver may be allocated so that the body area includes either at least a portion or the entire portion of an area within the data group having the enhanced data continuously outputted therefrom. Herein, the body area may also include an area having the enhanced data outputted non-continuously.

Therefore, the group formatter 513 inserts the enhanced data inserted in the corresponding area within the above-described data group. For example, the group formatter 513 allocates the received enhanced data to the body area. And, apart from the enhanced data, the group formatter 513 also separately allocates signaling information indicating the overall transmission information to the body area. In other words, the signaling information corresponds to information required by the receiving system for receiving and processing the data included data group. Herein, the signaling information includes data group information, multiplexing information, and so on. Furthermore, the group formatter 513 also inserts an MPEG header place holder, a non-systematic RS parity place holder, and a main data place holder in relation with the data deinterleaving.

The block processor 514 performs additional encoding only on the enhanced data outputted from the group formatter 513. For example, if a 2-byte expansion has been performed in the randomizer/byte expander 512, the block processor 514 encodes the enhanced data at a 1/2 coding rate. Alternatively, if a 4-byte expansion has been performed in the randomizer/byte expander 512, the block processor 514 encodes the enhanced data at a 1/4 coding rate. In addition, the MPEG header place holder, the main data place holder, and the RS parity place holder are outputted directly without any modifications. Furthermore, the known data (or known data place holder) and the initialization data place holder may be directly outputted without modification or replaced with the known data generated from the block processor 514 and then outputted. The method of directly outputting the data or data holder without any modification is shown in FIG. 9, and the method of replacing the data or data holder with the known data is shown in FIG. 10.

Figure 9:
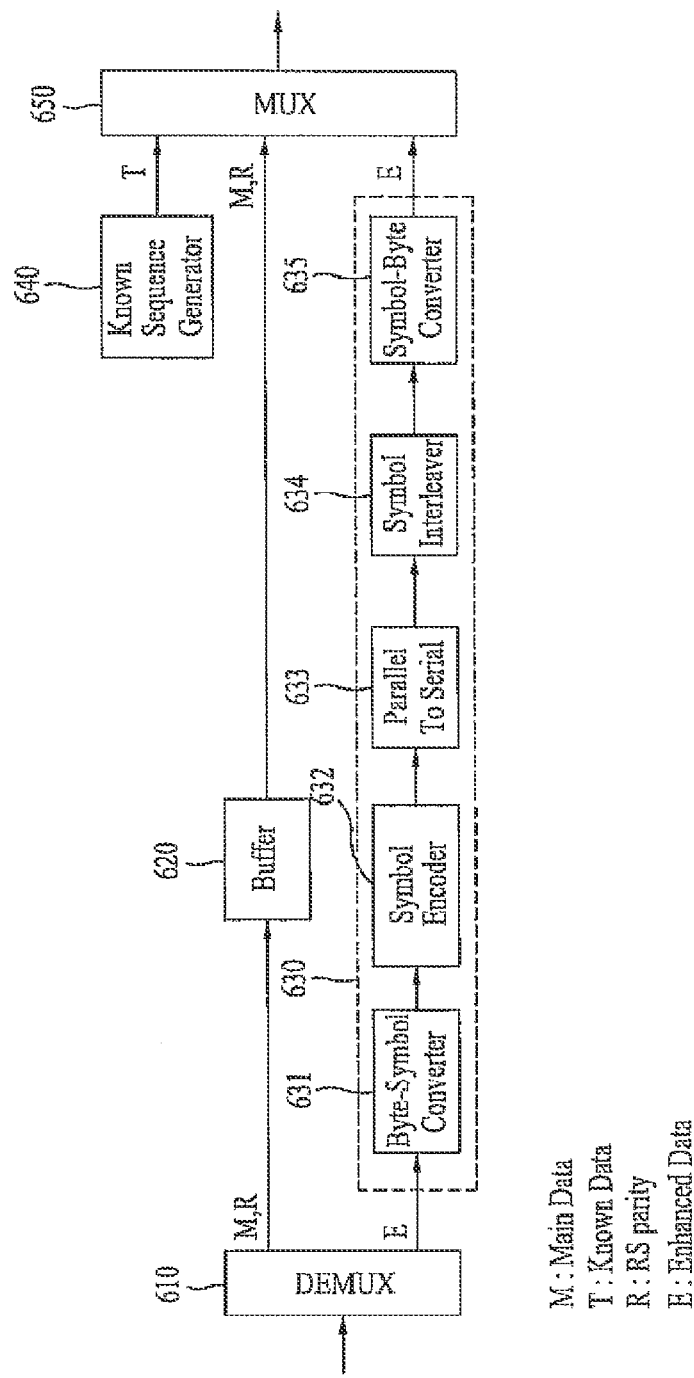
FIG. 9 and FIG. 10 illustrate block diagrams of a block processor shown in FIG. 8.
Figure 10:
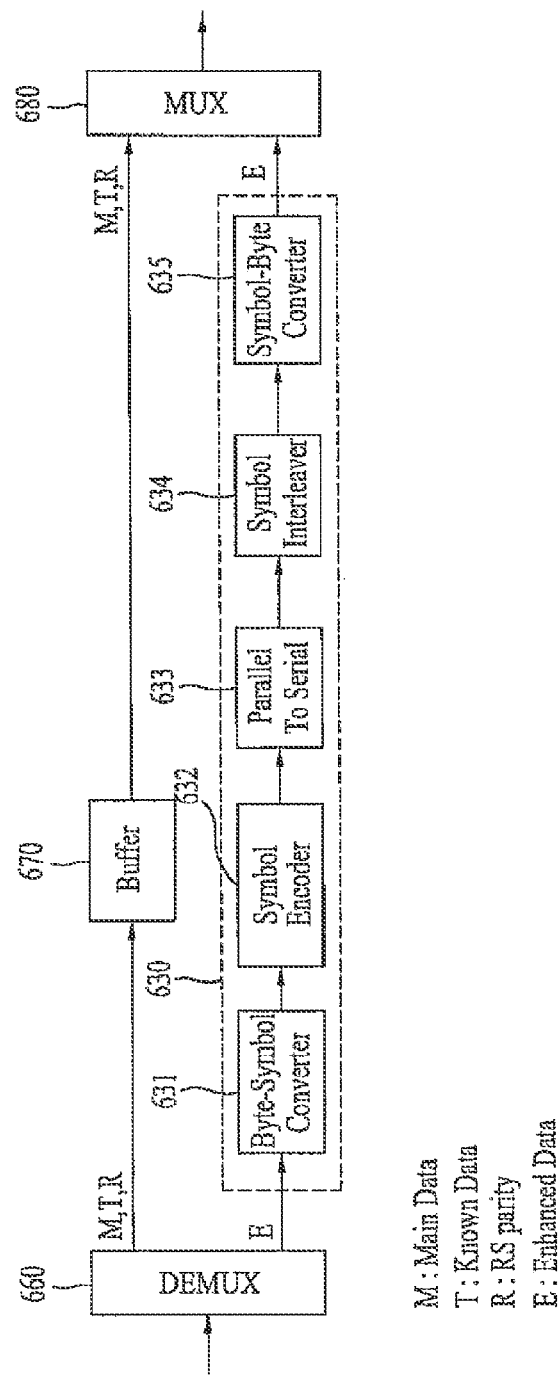

Referring to FIG. 9, the block processor 514 includes a demultiplexer 610, a buffer 620, an enhanced encoder 630, a known data (or sequence) generator 640, and a multiplexer 650. The enhanced encoder 630 includes a byte-symbol converter 631, a symbol encoder 632, a parallel-to-serial converter 633, a symbol interleaver 634, and a symbol-byte converter 635. In FIG. 9, when the inputted data correspond to the main data place holder, the MPEG header place holder, and the RS parity place holder, the demultiplexer 610 outputs the input data to the buffer 620. On the other hand, if the input data correspond to the enhanced data, the demultiplexer 610 outputs the input data to the enhanced encoder 630. The buffer 620 delays the main data place holder, the MPEG header place holder, and the RS parity place holder for a predetermined period of time and outputs the delayed place holders to the multiplexer 640. More specifically, when the data inputted to the demultiplexer 610 correspond to the main data place holder, the MPEG header place holder, and the RS parity place holder, a difference in time occurs while the enhanced data undergo an additional encoding process. Herein, the buffer 620 is used to delay the input data as much as the time difference and to compensate for the delayed data. The data having the time difference adjusted by the buffer 620 are then transmitted to the data deinterleaver 515 through the multiplexer 640.

Alternatively, when the data inputted to the demultiplexer 610 correspond to the known data, a known data place holder is inserted from the group formatter 513. Then, by selecting a training sequence T outputted from the known data generator 640 instead of the known data place holder from the multiplexer 650 of the block processor 514, the known data is outputted without any additional encoding. At this point, the initialization data place holder inserted from the group formatter 513 may be directly outputted, or the known data outputted from the known data generator 640 may be outputted instead of the initialization data place holder. Herein, the known data outputted instead of the initialization data place holder may be replaced with an initialization symbol at the trellis encoding module 127.

Meanwhile, the byte-symbol converter 631 of the enhanced encoder 630 converts an enhanced data byte to 4 symbols, which are then outputted to the symbol encoder 632. Herein, the symbol encoder 632 is operated as a G/H coding rate encoder encoding G bits of enhanced data to H bits. For example, if 1 bit of enhanced data is coded to 2 bits and outputted, then G is equal to 1 and H is equal to 2 (i.e., G=1 and H=2). Alternatively, if 1 bit of enhanced data is coded to 4 bits and outputted, then G is equal to 1 and H is equal to 4 (i.e., G=1 and H=4). The symbol encoder 632 only encodes and outputs input symbol bits having valid data included therein.

For example, assuming that 1 enhanced data byte is expanded to 2 bytes by inserting a null data bit in between the enhanced data bits at the randomizer/byte expander 512, the symbol encoder 632 may code only the valid data bit among the symbol configured of a null data bit and a valid data bit so as to output 2 bits. In this case, the encoder is operated as a 1/2-coding rate encoder. Alternatively, assuming that 1 enhanced data byte is expanded to 4 bytes by inserting null data bits in between the enhanced data bits at the randomizer/byte expander 512, the symbol encoder 632 may code only the valid data bit among the 2 symbols configured of 3 null data bits and a valid data bit so as to output 4 bits. Furthermore, as another example, only the valid data bit among the symbol configured of a null data bit and a valid data bit may be coded so as to create 2 bits. Thereafter, the 2 coded bits may be repeated so as to create 4 final output bits. Finally, only the valid data bit among the symbol configured of a null data bit and a valid data bit may be coded two times at a 1/2-coding rate. Accordingly, when the coded symbols are outputted, 4 final bits may be outputted. In all of the above described cases, the encoder is operated as a 1/4-coding rate encoder. More specifically, the enhanced data length is identical at both the inputting end and outputting end of the symbol encoder 632. Further, the error correction is more effective when the valid data bit is outputted at a 1/4-coding rate than when outputted at a 1/2-coding rate.

FIG. 4 and FIG. 5 may be applied to the symbol encoder 632. However, in this case, the input bit U of FIGS. 4 and 5 corresponds to the bit having the valid data among the input symbol. In other words, if the symbol encoder of FIGS. 4 and 5 is designed to code only the valid data bit among the input symbol, the same symbol encoder may be applied to FIG. 9 and FIG. 10. If one enhanced data byte is expanded to 2 bytes in the randomizer/byte expander 512, the valid data bit is inputted by one symbol unit. Alternatively, one enhanced data byte is expanded to 4 bytes in the randomizer/byte expander 512, the valid data bit is inputted by two symbol units.

If the symbol encoder 632 is operated as a 1/2-rate encoder, the output of the symbol encoder 632 directly bypasses the parallel-to-serial converter 633 and is inputted to the symbol interleaver 634. In this case, the parallel-to-serial converter 633 may be omitted. Alternatively, if the symbol encoder 632 is operated as a 1/4-rate encoder, the output of the symbol encoder 632 is inputted to the parallel-to-serial converter 633, thereby being converted to a serial symbol, and then inputted to the symbol interleaver 634. This is because, when the symbol encoder 632 is operated as a 1/4-rate encoder, 2 symbols (i.e., 4 bits) are outputted in parallel from the symbol encoder, and also because the symbol interleaver 634 performs interleaving by a 1-symbol unit (i.e., a 2-bit symbol). Therefore, the two symbols being inputted in parallel to the parallel-to-serial converter 633 in converted to two serial symbols, thereby sequentially outputting the two symbols to the symbol interleaver 634.

The symbol interleaver 634 receives the output of the parallel-to-serial converter 633, so as to rearrange the symbol order by performing block interleaving in symbol units, thereby outputting the rearranged symbols to the symbol-byte converter 635. The symbol-byte converter 635 converts the output symbols of the symbol interleaver 634 to byte units and outputs the byte-converted symbols to the multiplexer 650. When the data inputted to the multiplexer 650 correspond to the main data place holder, the MPEG header place holder, and the RS parity place holder, the multiplexer 650 selects the data outputted from the buffer 620. On the other hand, when the data inputted to the multiplexer 650 correspond to the enhanced data, the multiplexer 650 selects the enhanced data coded and outputted from the enhanced encoder 630. Further, when the data inputted to the multiplexer 650 correspond to the known data place holder (or known data), the multiplexer 650 selects the training sequence T that outputted from the known data generator 640 instead of the known data place holder and, then, outputs the selected data to the data deinterleaver 515.

FIG. 10 is very similar to FIG. 9. However, the difference between the two drawings in the known data processing part. More specifically, referring to FIG. 10, when the data inputted to the demultiplexer 660 correspond to the known data, the demultiplexer 660 outputs the inputted data to the buffer 670, so as to delay the data for a predetermined period of time. Thereafter, the demultiplexer 660 outputs the delayed data to the data deinterleaver 114 through the multiplexer 680. The remaining parts of FIG. 10 are identical to those of FIG. 9, and therefore, detailed description of the same will be omitted for simplicity. In this case, it is assumed that the known data are already inserted in the enhanced data packet by the group formatter 513.

As described above, the data being coded, replaced, and bypassed by the block processor 514 are inputted to the data interleaver 515. Thereafter, the data interleaver 515 performs an inverse process of the data interleaver 124 by deinterleaving the inputted data and outputting the deinterleaved data to the packet formatter 516. The packet formatter 516 receives the data outputted from the data deinterleaver 515. Subsequently, the data deinterleaver 515 removes the main data place holder and the RS parity place holder, which were allocated for the deinterleaving process, from the deinterleaved input data. Then, the data deinterleaver 515 gathers (or groups) the remaining portion of the deinterleaved data and inserts MPEG headers in the place of the 4-byte MPEG header place holder.

The packet formatter 516 configures the packet-formatted data to a 188-byte MPEG TS packet and provides the 188-byte MPEG TS packet to the packet multiplexer 121. The packet multiplexer 121 multiplexes the 188-byte enhanced data packet outputted from the packet formatter 516 and the main data packet, thereby outputting the multiplexed data to the data randomizer 122. The multiplexing method will be described in detail with reference to FIG. 1. The remaining process steps are identical to those of FIG. 1, and the detailed description of the same will, therefore, be omitted for simplicity.

Figure 11:
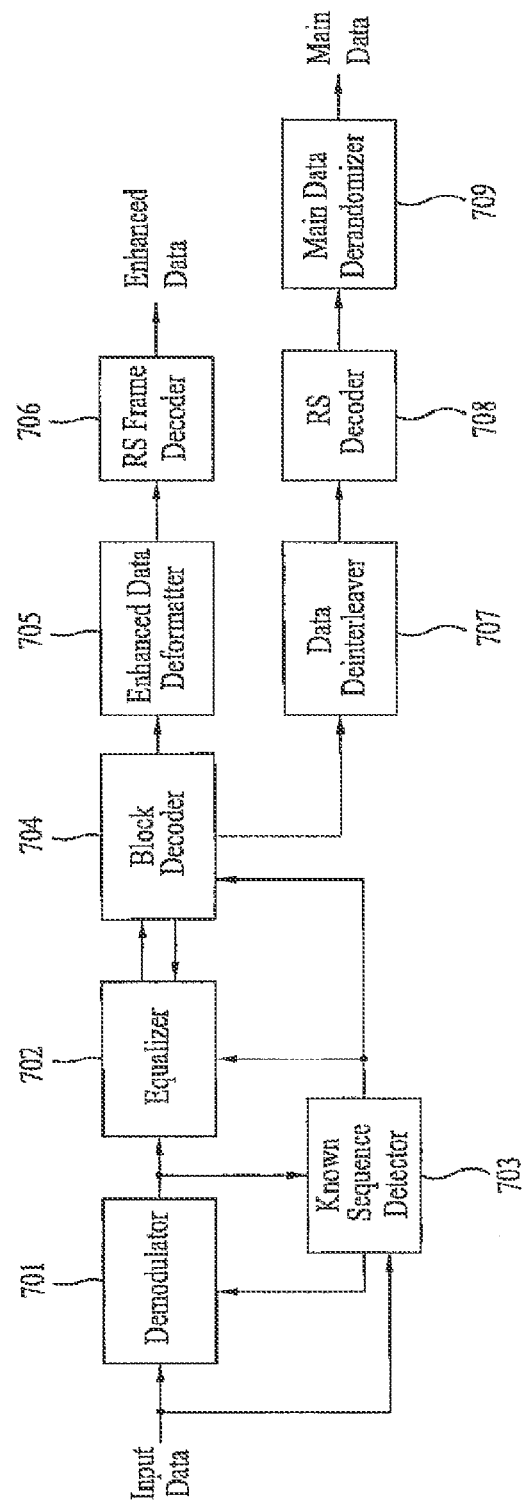
FIG. 11 illustrates a block diagram showing a structure of a demodulating unit included a digital television receiving system according to an embodiment of the present invention.

FIG. 11 illustrates an example of a demodulating unit included a digital broadcast receiving system receiving data transmitted by the above-described digital broadcast transmitting system, thereby recovering the received data to its initial state by demodulating and equalizing the received data. Referring to FIG. 11, the demodulating unit according to the present invention includes a demodulator 701, equalizer 702, a known sequence detector 703, a block decoder 704, an enhanced data deformatter 705, a RS frame decoder 706, a data deinterleaver 707, a RS decoder 708, and a main data derandomizer 709.

More specifically, the received signal through a tuner inputs to the demodulator 701 and the known sequence detector 703. The demodulator 701 performs automatic gain control, carrier recovery and timing recovery, etc., for the inputted signal to generate a baseband signal, and then output it to the equalizer 702 and the known sequence detector 703. The equalizer 702 compensates the distortion of the channel included in the demodulated signal and then outputs the error-compensated signal to the block decoder 704.

At this point, the known sequence detector 703 detects the known data sequence place inserted by the transmitting end from the input/output data of the demodulator 701 (i.e., the data prior to the demodulation or the data after the modulation). Thereafter, the place information along with the symbol sequence of the known sequence, which is generated from the detected place, is outputted to the demodulator 701, the equalizer 702, and the block decoder 704. Further, the known sequence detector 703 outputs information related to the enhanced data additionally encoded by the transmitting end and the main data that have not been additionally encoded to the block decoder 704. Herein, the outputted information is outputted to allow the enhanced data and the main data to be differentiated by the block decoder 704 of the receiving end and to find out the starting point of a block in the enhanced encoder. Although the connection state is not shown in FIG. 11, the information detected by the known sequence detector 703 may be used throughout almost the entire receiving system. Herein, the detected information may also be used in the enhanced data deformatter 705 and in the RS frame decoder 706.

The demodulator 701 uses the known data symbol sequence during the timing and/or carrier recovery, thereby enhancing the demodulating quality. Similarly, the equalizer 702 uses the known data sequence, thereby enhancing the equalizing quality. Furthermore, the decoding result of the block decoder 704 may also be fed-back to the equalizer 702, thereby enhancing the equalizing quality.

Meanwhile, when the data being inputted to the block decoder 704 correspond to the enhanced data being additionally coded and trellis-encoded by the transmitting end, the equalizer 702 performs an inverse process of the transmitting end by additionally decoding and trellis-decoding the inputted enhanced data. On the other hand, when the data being inputted correspond to the main data being trellis-encoded only and not additionally coded, the equalizer 702 only performs trellis-decoding on the inputted main data. The data group decoded by the block decoder 704 is inputted to the enhanced data deformatter 705, and the trellis-encoded data are inputted to the data deinterleaver 707. More specifically, when the inputted data correspond to the main data, the block decoder 704 performs Viterbi-decoding on the input data so as to output a hard decision value or to perform hard decision on a soft decision value and output the hard-decided result. Meanwhile, when the inputted data correspond to the enhanced data, the block decoder 704 outputs a hard decision value or a soft decision value on the inputted enhanced value.

When the inputted data correspond to the enhanced data, the block decoder 704 performs a decoding process on the data encoded by the block processor 113 or 514 and trellis encoding module 127 of the DTV transmitting system. At this point, the data outputted from the RS frame encoder 111 or 511 of the pre-processor 110 or 510 included in the DTV transmitting system may correspond to an external code, and the data outputted from each of the block processor 113 or 514 and the trellis encoding module 127 may correspond to an internal code.

When decoding such concatenated codes, the decoder of the internal code should output a soft decision value, so that the external coding performance can be enhanced. Therefore, the block decoder 704 may also output a hard decision value on the enhanced data and, preferably, a soft decision value may be outputted when required. More specifically, any one of a soft decision value and a hard decision value is outputted with respect to the enhanced data depending upon the overall design or conditions of the system, and a hard decision value is outputted with respect to the main data.

Meanwhile, the data deinterleaver 707, the RS decoder 708, and the main data derandomizer 709 are blocks required for receiving the main data. Therefore, these blocks may not be required in the structure of a DTV receiving system that only receives the enhanced data. The data deinterleaver 707 performs an inverse process of the data interleaver included in the DTV transmitting system. More specifically, the data deinterleaver 707 deinterleaves the main data and outputs the deinterleaved data to the RS decoder 708. The RS decoder 708 performs RS decoding on the deinterleaved data and outputs the RS-decoded data to the main data derandomizer 709. The main data derandomizer 709 receives the output of the RS decoder 708 and generates a pseudo random data byte identical to that of the randomizer included in the DTV transmitting system. Thereafter, the main data derandomizer 709 performs a bitwise exclusive OR (XOR) operation on the generated pseudo random data byte, thereby inserting the MPEG synchronization bytes to the beginning of each packet so as to output the data in 188-byte main data packet units.

The data being outputted from the block decoder 704 are inputted to the enhanced data deformatter 705 in the format of the data group, as shown in FIG. 6. At this point, the enhanced data deformatter 705 already knows the configuration of the input data. Therefore, the signaling information having the system information and enhanced data are differentiated in the body area within the data group. In addition, the enhanced data deformatter 705 removes the known data, trellis initialization data, and MPEG header that were inserted in the main data and data group and also removes the RS parity added by one of the RS encoder/non-systematic RS encoder 123 and non-systematic RS encoder 126 of the DTV transmitting system.

Furthermore, a derandomizing process is performed as an inverse process of the randomizer (shown in FIG. 1) or the randomizer/byte expander (shown in FIG. 5) in the DTV transmitting system on the enhanced data. At this point, the null data byte used for the byte expansion by the byte expander may be or may not be required to be removed. In other words, depending upon design of the DTV receiving system, the removal of the byte, which has been expanded by the byte expander of the DTV transmitting system, may be required. However, if the null data byte inserted during the byte expansion is removed and outputted by the block decoder 704, the expanded byte is not required to be removed. However, if the removal of the expanded byte is required, the order of the byte removal process and the derandomizing process may vary depending upon the structure of the DTV transmitting system. More specifically, if the byte expansion is performed after the randomizing process in the DTV transmitting system, then the byte removal process is first performed before performing the derandomizing process in the DTV receiving system. Conversely, if the order of the process is changed in the DTV transmitting system, the order of the respective processes in the DTV receiving system is also changed.

When performing the derandomizing process, if the RS frame decoder 706 requires a soft decision in a later process, and if, therefore, the block decoder 704 receives a soft decision value it is difficult to perform an XOR operation between the soft decision and the pseudo random bit, which is used for the derandomizing process. Accordingly, when an XOR operation is performed between the pseudo random bit and the soft decision value of the enhanced data bit, and when the pseudo random bit is equal to '1', the enhanced data deformatter 705 changes the code of the soft decision value and then outputs the changed code. On the other hand, if the pseudo random bit is equal to '0', the enhanced data deformatter 705 outputs the soft decision value without any change in the code. Thus, the state of the soft decision may be maintained and transmitted to the RS frame decoder 706.

If the pseudo random bit is equal to '1' as described above, the code of the soft decision value is changed because, when an XOR operation is performed between the pseudo random bit and the input data in the randomizer of the transmitting system, and when the pseudo random bit is equal to '1', the code of the output data bit becomes the opposite of the input data (i.e., 0 XOR 1=1 and 1 XOR 0=0). More specifically, if the pseudo random bit generated from the enhanced data deformatter 705 is equal to '1', and when an XOR operation is performed on the hard decision value of the enhanced data bit, the XOR-operated value becomes the opposite value of the hard decision value. Therefore, when the soft decision value is outputted, a code opposite to that of the soft decision value is outputted.

The RS frame decoder 706 performs an inverse process of the RS frame encoder 111 in the DTV transmitting system. More specifically, by performing at least any one of the error detection decoding, the inversed row permutation, and the error correction decoding processes, the enhanced data may be recovered to its initial state.

Figure 12:
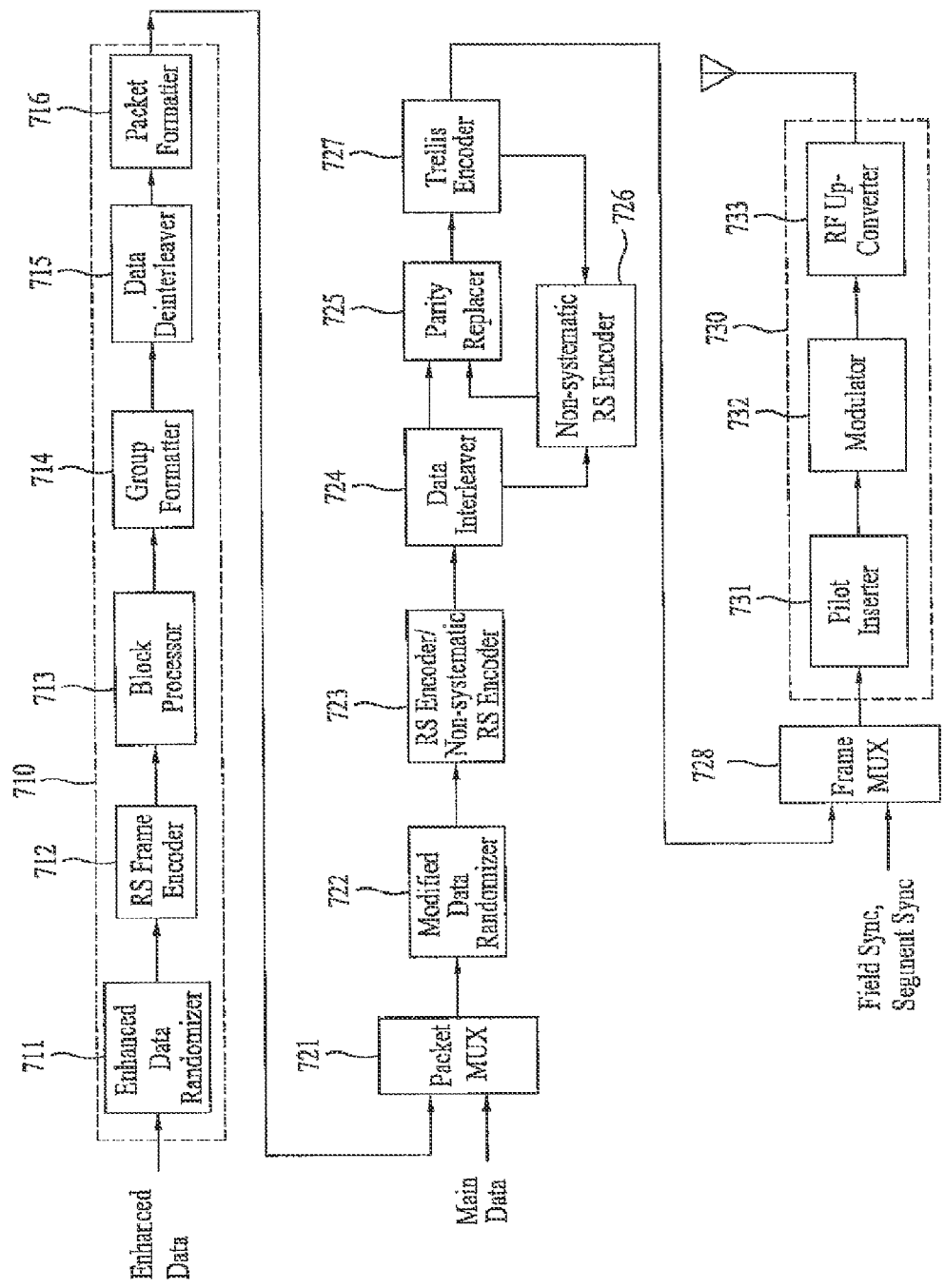
FIG. 12 illustrates a block diagram of a digital broadcast (or television or DTV) transmitting system according to another embodiment of the present invention.

FIG. 12 illustrates a block diagram showing the structure of a digital broadcast transmitting system according to an embodiment of the present invention. The digital broadcast (or DTV) transmitting system includes a pre-processor 710, a packet multiplexer 721, a data randomizer 722, a Reed-Solomon (RS) encoder/non-systematic RS encoder 723, a data interleaver 724, a parity byte replacer 725, a non-systematic RS encoder 726, a frame multiplexer 728, and a transmitting system 730. The pre-processor 710 includes an enhanced data randomizer 711, a RS frame encoder 712, a block processor 713, a group formatter 714, a data deinterleaver 715, and a packet formatter 716.

In the present invention having the above-described structure, main data are inputted to the packet multiplexer 721. Enhanced data are inputted to the enhanced data randomizer 711 of the pre-processor 710, wherein an additional coding process is performed so that the present invention can respond swiftly and appropriately against noise and change in channel. The enhanced data randomizer 711 randomizes the received enhanced data and outputs the randomized enhanced data to the RS frame encoder 712. At this point, by having the enhanced data randomizer 711 perform the randomizing process on the enhanced data, the randomizing process on the enhanced data by the data randomizer 722 in a later process may be omitted. Either the randomizer of the conventional broadcast system may be used as the randomizer for randomizing the enhanced data, or any other type of randomizer may be used herein.

The RS frame encoder 712 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame multiplexer 712 also includes a process of mixing in row units many sets of enhanced data each having a predetermined size. By performing an error correction coding process on the inputted enhanced data, the RS frame encoder 712 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 712 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiving system. For example, assuming that the size of one RS frame is 187*N bytes, that (235, 187)–RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 712 is inputted to the block processor 713. The block processor 713 codes the RS-coded and CRC-coded enhanced data at a coding rate of G/H. Then, the block processor 713 outputs the G/H-rate coded enhanced data to the group formatter 714. In order to do so, the block processor 713 identifies the block data bytes being inputted from the RS frame encoder 712 as bits.

The block processor 713 may receive supplemental information data such as signaling information, which include information on the system, and identifies the supplemental information data bytes as data bits. Herein, the supplemental information data, such as the signaling information, may equally pass through the enhanced data randomizer 711 and the RS frame encoder 712 so as to be inputted to the block processor 713. Alternatively, the supplemental information data may be directly inputted to the block processor 713 without passing through the enhanced data randomizer 711 and the RS frame encoder 712. The signaling information corresponds to information required for receiving and processing data included in the data group in the receiving system. Such signaling information includes data group information, multiplexing information, and burst information.

As a G/H-rate encoder, the block processor 713 codes the inputted data at a coding rate of G/H and then outputs the G/H-rate coded data. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). As an example of the present invention, it is assumed that the block processor 713 performs a coding process at a coding rate of 1/2 (also referred to as a 1/2-rate coding process) or a coding process at a coding rate of 1/4 (also referred to as a 1/4-rate coding process). More specifically, the block processor 713 codes the received enhanced data and supplemental information data, such as the signaling information, at either a coding rate of 1/2 or a coding rate of 1/4. Thereafter, the supplemental information data, such as the signaling information, are identified and processed as enhanced data.

Since the 1/4-rate coding process has a higher coding rate than the 1/2-rate coding process, greater error correction ability may be provided. Therefore, in a later process, by allocating the 1/4-rate coded data in an area with deficient receiving performance within the group formatter 714, and by allocating the 1/2-rate coded data in an area with excellent receiving performance, the difference in the overall performance may be reduced. More specifically, in case of performing the 1/2-rate coding process, the block processor 713 receives 1 bit and codes the received 1 bit to 2 bits (i.e., 1 symbol). Then, the block processor 713 outputs the processed 2 bits (or 1 symbol). On the other hand, in case of performing the 1/4-rate coding process, the block processor 713 receives 1 bit and codes the received 1 bit to 4 bits (i.e., 2 symbols). Then, the block processor 713 outputs the processed 4 bits (or 2 symbols). Additionally, the block processor 713 performs a block interleaving process in symbol units on the symbol-coded data. Subsequently, the block processor 713 converts to bytes the data symbols that are block-interleaved and have the order rearranged.

The group formatter 714 inserts the enhanced data outputted from the block processor 713 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group. At this point, the data group may be described by at least one hierarchical area. Herein, the data allocated to the each area may vary depending upon the characteristic of each hierarchical area. Additionally, each data group may be configured to include a field synchronization signal.

In another example given in the present invention, a data group is divided into A, B, and C regions in a data configuration prior to data deinterleaving.

Figure 13:
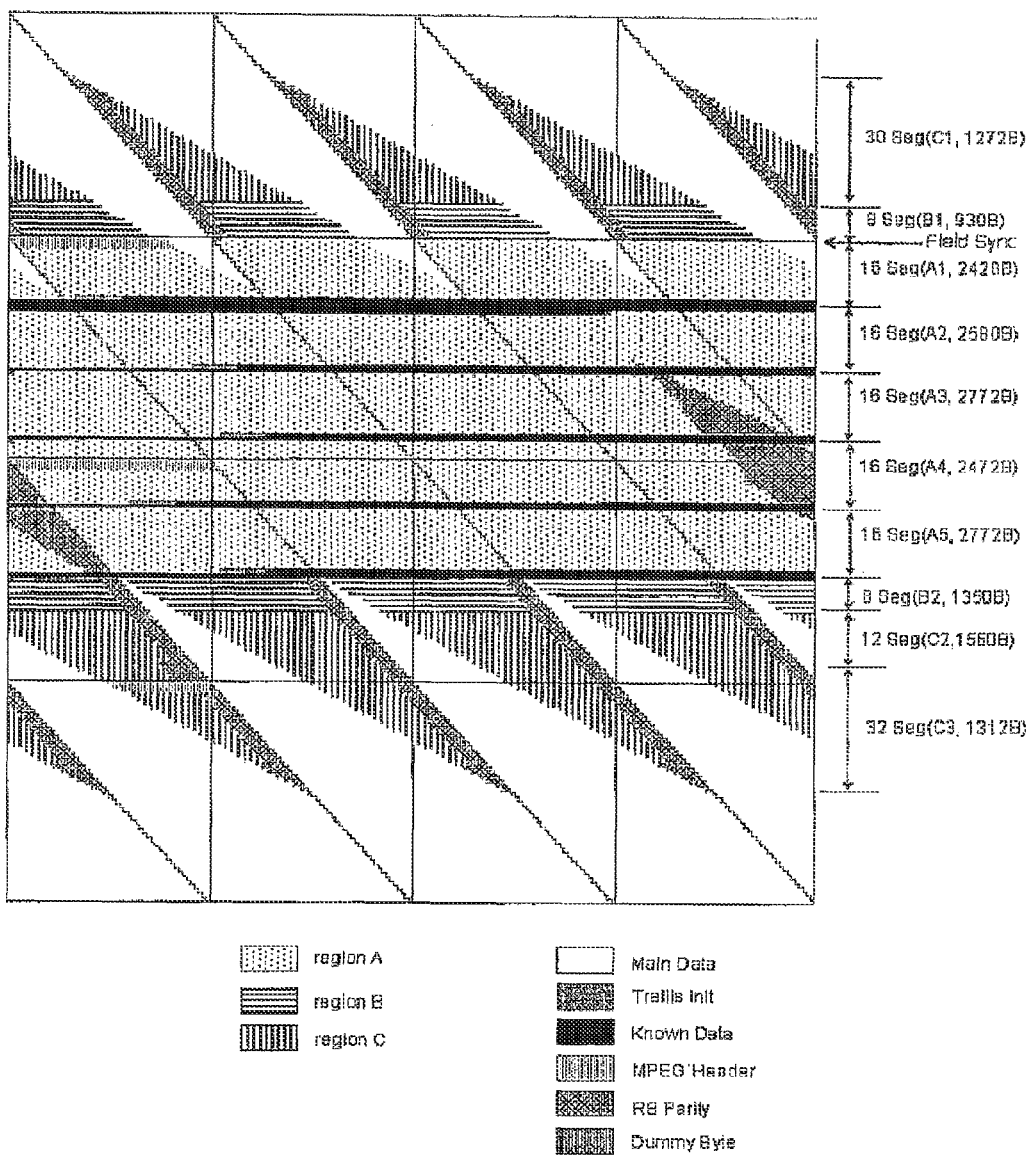
FIG. 13 and FIG. 14 illustrate another examples of data configuration at before and after ends of a data deinterleaver in a transmitting system according to the present invention.
Figure 14:
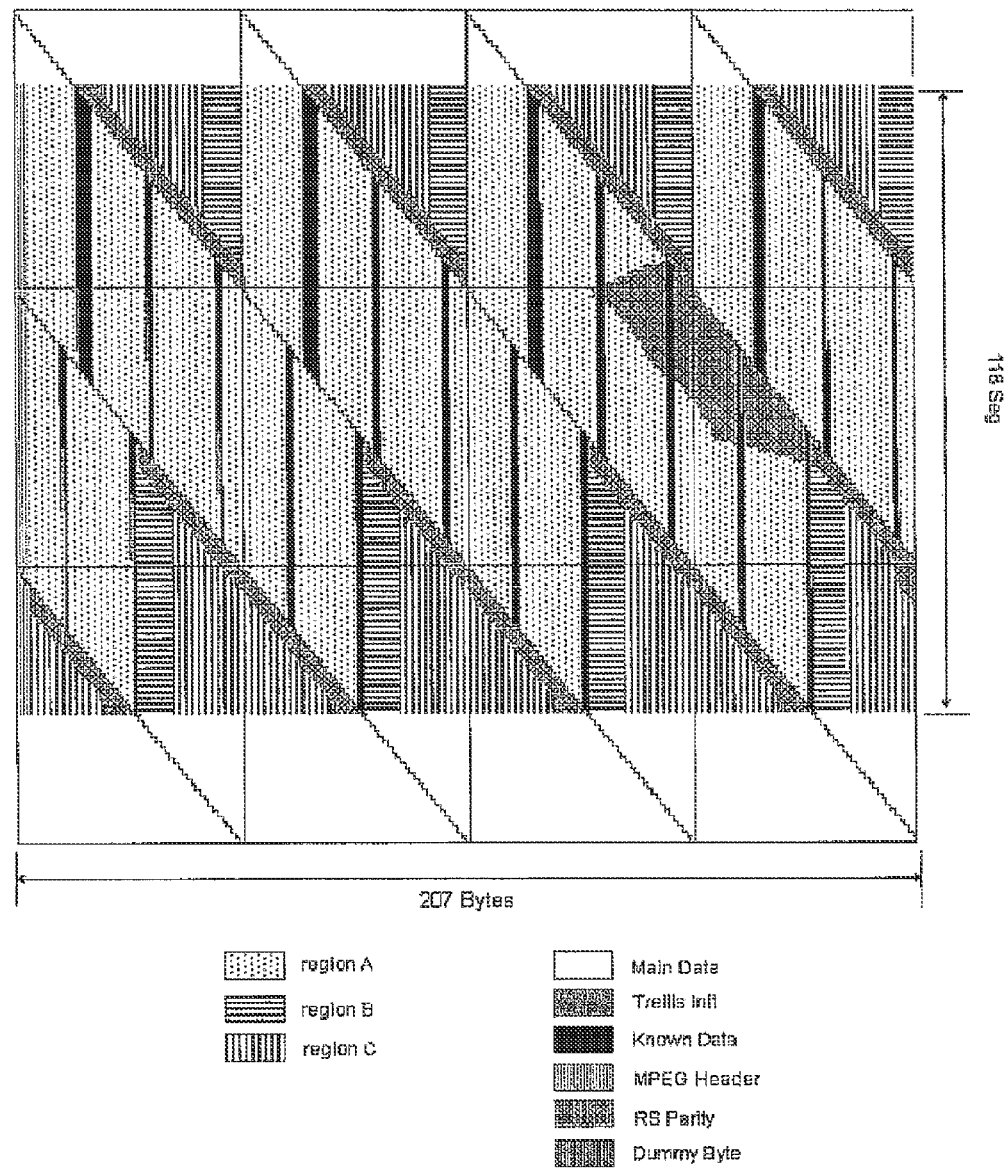

FIG. 13 illustrates an alignment of data before being data deinterleaved and identified, and FIG. 14 illustrates an alignment of data after being data deinterleaved and identified. More specifically, a data structure identical to that shown in FIG. 13 is transmitted to a receiving system. Also, the data group configured to have the same structure as the data structure shown in FIG. 13 is inputted to the data deinterleaver 715.

As described above, FIG. 13 illustrates a data structure prior to data deinterleaving that is divided into 3 regions, such as region A, region B, and region C. Also, in the present invention, each of the regions A to C is further divided into a plurality of regions. Referring to FIG. 13, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of enhanced data, which are inputted, may also vary depending upon the characteristic of each region.

In the example of the present invention, the data structure is divided into regions A to C based upon the level of interference of the main data. Herein, the data group is divided into a plurality of regions to be used for different purposes. More specifically, a region of the main data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the enhanced data, the known data having a predetermined length may be periodically inserted in the region having no interference from the main data (e.g., region A). However, due to interference from the main data, it is difficult to periodically insert known data and also to insert consecutively long known data to a region having interference from the main data (e.g., region B and region C).

Hereinafter, examples of allocating data to region A (A1 to A5), region B (B1 and B2), and region C (C1 to C3) will now be described in detail with reference to FIG. 13. The data group size, the number of hierarchically divided regions within the data group and the size of each region, and the number of enhanced data bytes that can be inserted in each hierarchically divided region of FIG. 13 are merely examples given to facilitate the understanding of the present invention. Herein, the group formatter 714 creates a data group including places in which field synchronization bytes are to be inserted, so as to create the data group that will hereinafter be described in detail.

More specifically, region A is a region within the data group in which a long known data sequence may be periodically inserted, and in which includes regions wherein the main data are not mixed (e.g., A1 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 13, 2428 bytes of the enhanced data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the enhanced data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 930 bytes of the enhanced data may be inserted in the region B1, and 1350 bytes may be inserted in region B2. Similarly, trellis initialization data or known data, MPEG header, and RS parity are not included in the enhanced data. In case of region B, the receiving system may perform equalization by using channel information obtained from the field synchronization section. Alternatively, the receiving system may also perform equalization by using channel information that may be obtained from the last known data sequence, thereby enabling the system to respond to the channel changes.

Region C includes a region located within 30 segments including and preceding the $9^{th}$ segment of the field synchronization region (chronologically located before region A) (e.g., region C1), a region located within 12 segments including and following the $9^{th}$ segment of the very last known data sequence within the data group (chronologically located after region A) (e.g., region C2), and a region located in 32 segments after the region C2 (e.g., region C3). For example, 1272 bytes of the enhanced data may be inserted in the region C1, 1560 bytes may be inserted in region C2, and 1312 bytes may be inserted in region C3. Similarly, trellis initialization data or known data, MPEG header, and RS parity are not included in the enhanced data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 713 may encode the enhanced data, which are to be inserted to each region based upon the characteristic of each hierarchical region, at a different coding rate. For example, the block processor 713 may encode the enhanced data, which are to be inserted in regions A1 to A5 of region A, at a coding rate of 1/2. Then, the group formatter 714 may insert the 1/2-rate encoded enhanced data to regions A1 to A5.

The block processor 713 may encode the enhanced data, which are to be inserted in regions B1 and B2 of region B, at a coding rate of 1/4 having higher error correction ability as compared to the 1/2-coding rate. Then, the group formatter 714 inserts the 1/4-rate coded enhanced data in region B1 and region B2. Furthermore, the block processor 713 may encode the enhanced data, which are to be inserted in regions C1 to C3 of region C, at a coding rate of 1/4 or a coding rate having higher error correction ability than the 1/4-coding rate. Then, the group formatter 714 may either insert the encoded enhanced data to regions C1 to C3, as described above, or leave the data in a reserved region for future usage.

In addition, the group formatter 714 also inserts supplemental data, such as signaling information that notifies the overall transmission information, other than the enhanced data in the data group. Also, apart from the encoded enhanced data outputted from the block processor 713, the group formatter 714 also inserts MPEG header place holders, non-systematic RS parity place holders, main data place holders, which are related to data deinterleaving in a later process, as shown in FIG. 13. Herein, the main data place holders are inserted because the enhanced data bytes and the main data bytes are alternately mixed with one another in regions B and C based upon the input of the data deinterleaver, as shown in FIG. 13. For example, based upon the data outputted after data deinterleaving, the place holder for the MPEG header may be allocated at the very beginning of each packet.

Furthermore, the group formatter 714 either inserts known data generated in accordance with a pre-determined method or inserts known data place holders for inserting the known data in a later process. Additionally, place holders for initializing the trellis encoder 727 are also inserted in the corresponding regions. For example, the initialization data place holders may be inserted in the beginning of the known data sequence. Herein, the size of the enhanced data that can be inserted in a data group may vary in accordance with the sizes of the trellis initialization place holders or known data (or known data place holders), MPEG header place holders, and RS parity place holders.

The output of the group formatter 714 is inputted to the data deinterleaver 715. And, the data deinterleaver 715 deinterleaves data by performing an inverse process of the data interleaver on the data and place holders within the data group, which are then outputted to the packet formatter 716. More specifically, when the data and place holders within the data group configured, as shown in FIG. 13, are deinterleaved by the data deinterleaver 715, the data group being outputted to the packet formatter 716 is configured to have the structure shown in FIG. 14.

Among the data deinterleaved and inputted, the packet formatter 716 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 714 inserts the known data place holder, the packet formatter 716 may either insert actual known data in the known data place holder or output the known data place holder without any change or modification for a replacement insertion in a later process. Afterwards, the packet formatter 716 divides the data within the above-described packet-formatted data group into 188-byte unit enhanced data packets (i.e., MPEG TS packets), which are then provided to the packet multiplexer 721. The packet multiplexer 721 multiplexes the 188-byte unit enhanced data packet and main data packet outputted from the packet formatter 716 according to a pre-defined multiplexing method. Subsequently, the multiplexed data packets are outputted to the data randomizer 722. The multiplexing method may be modified or altered in accordance with diverse variables of the system design.

As an example of the multiplexing method of the packet multiplexer 721, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 722 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 723. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 723. This is because the randomizing process has already been performed on the enhanced data by the enhanced data randomizer 711 in an earlier process. Herein, a data randomizing process may or may not be performed on the known data (or known data place holder) and the initialization data place holder included in the enhanced data packet.

The RS encoder/non-systematic RS encoder 723 RS-codes the data randomized by the data randomizer 722 or the data bypassing the data randomizer 722. Then, the RS encoder/non-systematic RS encoder 723 adds a 20-byte RS parity to the coded data, thereby outputting the RS-parity-added data to the data interleaver 724. At this point, if the inputted data correspond to the main data packet, the RS encoder/non-systematic RS encoder 723 performs a systematic RS-coding process identical to that of the conventional receiving system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 724 corresponds to a byte unit convolutional interleaver. The output of the data interleaver 724 is inputted to the parity byte replacer 725 and the non-systematic RS encoder 726.

Meanwhile, a memory within the trellis encoding module 727, which is positioned after the parity byte replacer 725, should first be initialized in order to allow the output data of the trellis encoding module 727 so as to become the known data defined based upon an agreement between the receiving system and the transmitting system. More specifically, the memory of the trellis encoding module 727 should first be initialized before the known data sequence being inputted is trellis-encoded. At this point, the beginning of the known data sequence that is inputted corresponds to the initialization data place holder inserted by the group formatter 714 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 727, thereby generating the trellis memory initialization data accordingly. Due to the influence of the replace initialization data, a process of recalculating the RS parity, thereby replacing the RS parity outputted from the trellis encoding module 727 with the newly calculated RS parity is required. Accordingly, the non-systematic RS encoder 726 receives the enhanced data packet including the initialization data place holder that is to be replaced with the initialization data from the data interleaver 724 and also receives the initialization data from the trellis encoding module 727. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 725. Accordingly, the parity byte replacer 725 selects the output of the data interleaver 724 as the data within the enhanced data packet, and selects the output of the non-systematic RS encoder 726 as the RS parity. Thereafter, the parity byte replacer 725 outputs the selected data.

Meanwhile, if the main data packet is inputted, or if the enhanced data packet that does not include the initialization data place holder that is to be replaced, the parity byte replacer 725 selects the data and RS parity outputted from the data interleaver 724 and directly outputs the selected data to the trellis encoding module 727 without modification. The trellis encoding module 727 converts the byte-unit data to symbol-unit data and 12-way interleaves and trellis-encodes the converted data, which are then outputted to the frame multiplexer 728. The frame multiplexer 728 inserts field synchronization and segment synchronization signals in the output of the trellis encoding module 727 and then outputs the processed data to the transmitting unit 730. Herein, the transmitting unit 730 includes a pilot inserter 731, a modulator 732, and a radio frequency (RF) up-converter 733. The operation of the transmitting unit 730 is identical to the conventional transmitters. Therefore, a detailed description of the same will be omitted for simplicity.

Figure 15:
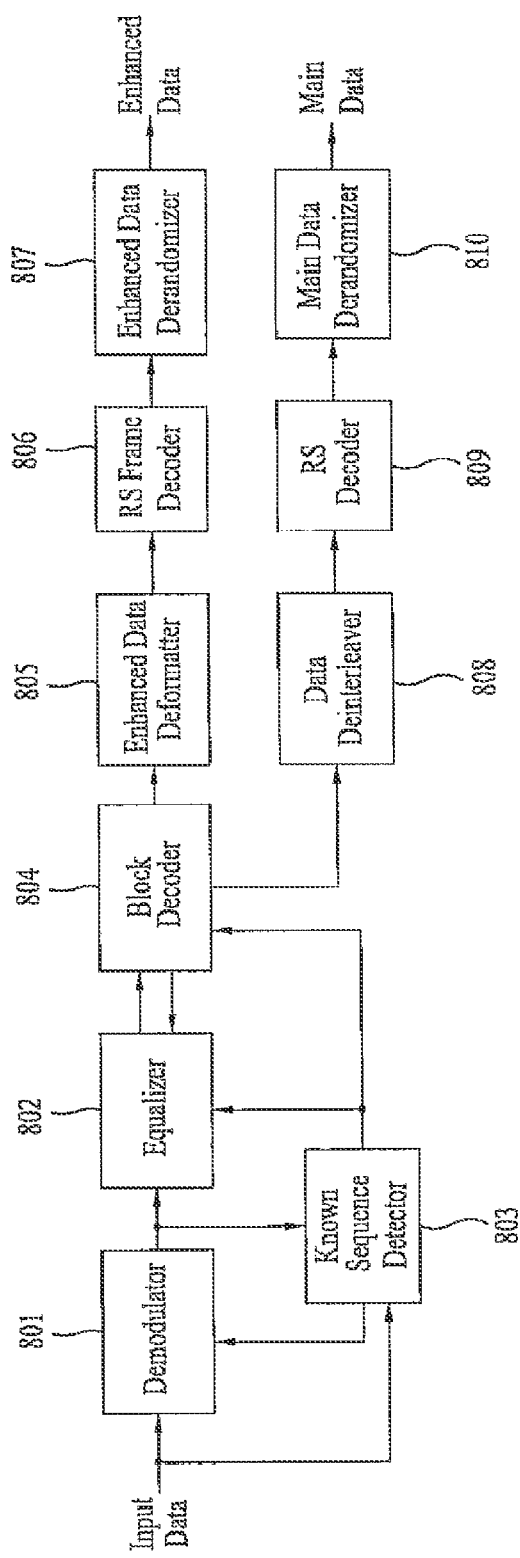
FIG. 15 illustrates a block diagram showing a general structure of a demodulating unit within a digital broadcast (or television or DTV) receiving system according to another embodiment of the present invention.

FIG. 15 illustrates a block diagram of a demodulating unit included in the receiving system according to another embodiment of the present invention. Herein, the demodulating unit may effectively process signals transmitted from the transmitting system shown in FIG. 12. Referring to FIG. 15, the demodulating unit includes a demodulator 801, a channel equalizer 802, a known data detector 803, a block decoder 804, an enhanced data deformatter 805, a RS frame decoder 806, an enhanced data derandomizer 807, a data deinterleaver 808, a RS decoder 809, and a main data derandomizer 810. For simplicity, the demodulator 801, the channel equalizer 802, the known data detector 803, the block decoder 804, the enhanced data deformatter 805, the RS frame decoder 806, and the enhanced data derandomizer 807 will be referred to as an enhanced data processor. And, the data deinterleaver 808, the RS decoder 809, and the main data derandomizer 810 will be referred to as a main data processor.

More specifically, the enhanced data including known data and the main data are received through the tuner and inputted to the demodulator 801 and the known data detector 803. The demodulator 801 performs automatic gain control, carrier wave recovery, and timing recovery on the data that are being inputted, thereby creating baseband data, which are then outputted to the equalizer 802 and the known data detector 803. The equalizer 802 compensates the distortion within the channel included in the demodulated data. Then, the equalizer 802 outputs the compensated data to the block decoder 804.

At this point, the known data detector 803 detects the known data place inserted by the transmitting system to the input/output data of the demodulator 801 (i.e., data prior to demodulation or data after demodulation). Then, along with the position information, the known data detector 803 outputs the symbol sequence of the known data generated from the corresponding position to the demodulator 801 and the equalizer 802. Additionally, the known data detector 803 outputs information enabling the block decoder 804 to identify the enhanced data being additionally encoded by the transmitting system and the main data that are not additionally encoded to the block decoder 804. Furthermore, although the connection is not shown in FIG. 15, the information detected by the known data detector 803 may be used in the overall receiving system and may also be used in the enhanced data formatter 805 and the RS frame decoder 806.

By using the known data symbol sequence when performing the timing recovery or carrier wave recovery, the demodulating performance of the demodulator 801 may be enhanced. Similarly, by using the known data, the channel equalizing performance of the channel equalizer 802 may be enhanced. Furthermore, by feeding-back the decoding result of the block decoder 804 to the channel equalizer 802, the channel equalizing performance may also be enhanced.

The channel equalizer 802 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 13. More specifically, in the example of the present invention, each region A, B, and C are further divided into regions A1 to A5, regions B1 and B2, and regions C1 to C3, respectively. Referring to FIG. 13, the CIR that is estimated from the field synchronization data in the data structure is referred to as CIR_FS. Alternatively, the CIRs that are estimated from each of the 5 known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions B2, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being channel equalized and then inputted to the block decoder 804 correspond to the enhanced data on which additional encoding and trellis encoding are both performed by the transmitting system, trellis-decoding and additional decoding processes are performed as inverse processes of the transmitting system. Alternatively, if the data being channel equalized and then inputted to the block decoder 804 correspond to the main data on which additional encoding is not performed and only trellis-encoding is performed by the transmitting system, only the trellis-decoding process is performed. The data group decoded by the block decoder 804 is inputted to the enhanced data deformatter 805, and the main data packet is inputted to the data deinterleaver 808.

More specifically, if the inputted data correspond to the main data, the block decoder 804 performs Viterbi decoding on the inputted data, so as to either output a hard decision value or hard-decide a soft decision value and output the hard-decided result. On the other hand, if the inputted correspond to the enhanced data, the block decoder 804 outputs either a hard decision value or a soft decision value on the inputted enhanced data. In other words, if the data inputted to the block decoder 804 correspond to the enhanced data, the block decoder 804 performs a decoding process on the data encoded by the block processor and the trellis encoder of the transmitting system. At this point, the output of the RS frame encoder included in the pre-processor of the transmitting system becomes an external code, and the output of the block processor and the trellis encoder becomes an internal code. In order to show maximum performance of the external code when decoding such connection codes, the decoder of the internal code should output a soft decision value. Therefore, the block decoder 804 may output a hard decision value on the enhanced data. However, when required, it is more preferable that the block decoder 804 outputs a soft decision value.

The present invention may also be used for configuring a reliability map using the soft decision value. The reliability map determines and indicates whether a byte corresponding to a group of 8 bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary. The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 808, the RS decoder 809, and the main data derandomizer 810 are blocks required for receiving the main data. These blocks may not be required in a receiving system structure that receives only the enhanced data. The data deinterleaver 808 performs an inverse process of the data interleaver of the transmitting system. More specifically, the data deinterleaver 808 deinterleaves the main data being outputted from the block decode 804 and outputs the deinterleaved data to the RS decoder 809. The RS decoder 809 performs systematic RS decoding on the deinterleaved data and outputs the systematically decoded data to the main data derandomizer 810. The main data derandomizer 810 receives the data outputted from the RS decoder 809 so as to generate the same pseudo random byte as that of the randomizer in the transmitting system. The main data derandomizer 810 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 805 from the block decoder 804 is a data group format. At this point, the enhanced data deformatter 805 already knows the structure of the input data. Therefore, the enhanced data deformatter 805 identifies the system information including signaling information and the enhanced data from the data group. Thereafter, the identified signaling information is transmitted to where the system information is required, and the enhanced data are outputted to the RS frame decoder 806. The enhanced data deformatter 805 removes the known data, trellis initialization data, and MPEG header that were included in the main data and the data group and also removes the RS parity that was added by the RS encoder/non-systematic RS encoder of the transmitting system. Thereafter, the processed data are outputted to the RS frame decoder 806.

More specifically, the RS frame decoder 806 receives the RS-coded and CRC-coded enhanced data from the enhanced data deformatter 805 so as to configure the RS frame. The RS frame decoder 806 performs an inverse process of the RS frame encoder included in the transmitting system, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 807. Herein, the enhanced data derandomizer 807 performs a derandomizing process, which corresponds to an inverse process of the enhanced data randomizer included in the transmitting system, on the received enhanced data. Then, by outputting the processed data, the enhanced data transmitted from the transmitting system can be obtained.

According to an embodiment of the present invention, the RS frame decoder 806 may also be configured as follows. The RS frame decoder 806 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g., 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 806 compares the absolute value of the soft decision value obtained from the block decoder 804 to the pre-determined threshold value so as to determine the reliability of the bit values that are decided by the code of the corresponding soft decision value. Then, 8 bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum number of errors (e.g., 48), which may be corrected by the RS erasure decoding process, a general decoding process is performed on the corresponding column. In other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 16:
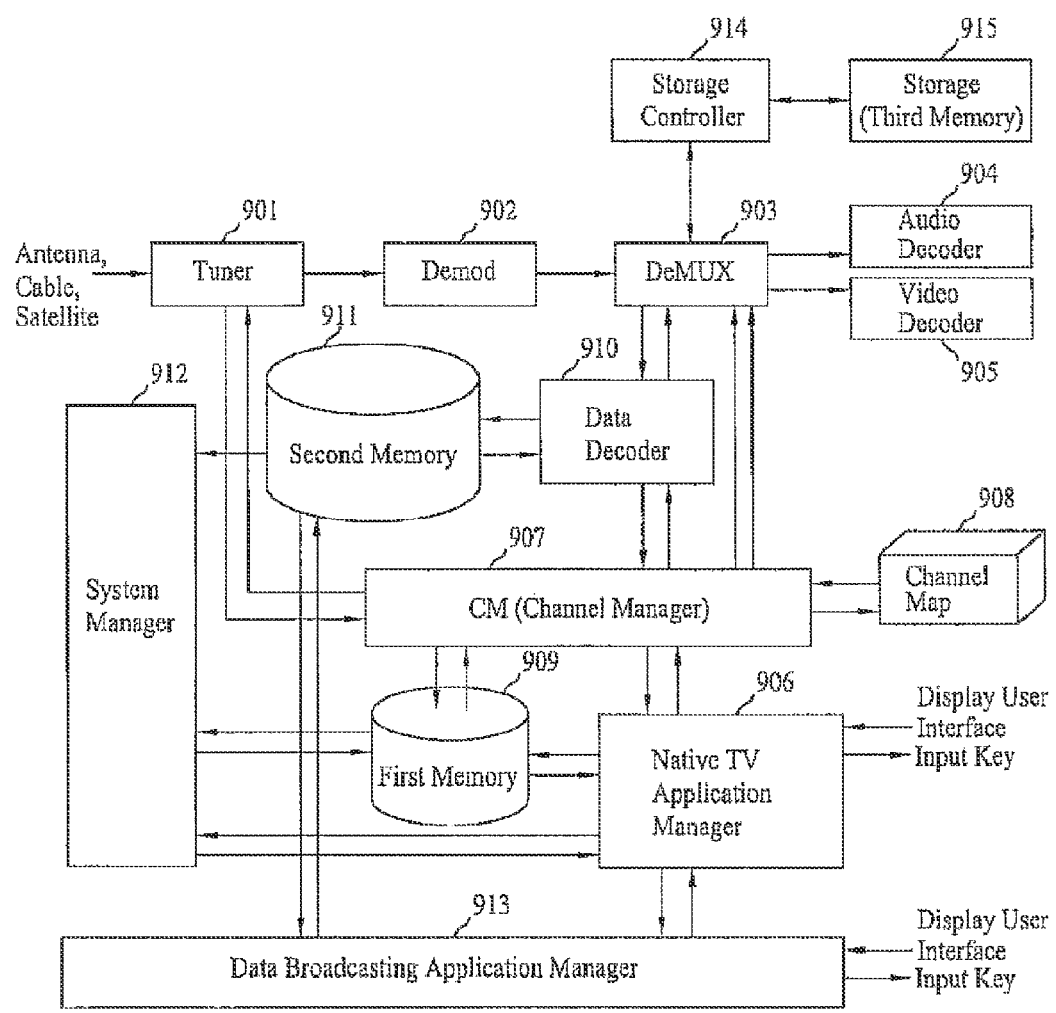
FIG. 16 illustrates a block diagram showing the structure of a digital broadcast (or television or DTV) receiving system according to an embodiment of the present invention.

FIG. 16 illustrates a block diagram showing the structure of a digital broadcast receiving system according to an embodiment of the present invention. Referring to FIG. 16, the digital broadcast receiving system includes a tuner 901, a demodulating unit 902, a demultiplexer 903, an audio decoder 904, a video decoder 905, a native TV application manager 906, a channel manager 907, a channel map 908, a first memory 909, a data decoder 910, a second memory 911, a system manager 912, a data broadcasting application manager 913, a storage controller 914, and a third memory 915. Herein, the third memory 915 is a mass storage device, such as a hard disk drive (HDD) or a memory chip. The tuner 901 tunes a frequency of a specific channel through any one of an antenna, cable, and satellite. Then, the tuner 901 down-converts the tuned frequency to an intermediate frequency (IF), which is then outputted to the demodulating unit 902. At this point, the tuner 901 is controlled by the channel manager 907. Additionally, the result and strength of the broadcast signal of the tuned channel are also reported to the channel manager 907. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 902 performs demodulation and channel equalization on the signal being outputted from the tuner 901, thereby identifying the main data and the enhanced data. Thereafter, the identified main data and enhanced data are outputted in TS packet units. Examples of the demodulating unit 902 are shown in FIG. 11 and FIG. 15. The demodulating unit shown in FIG. 11 and FIG. 15 is merely exemplary and the scope of the present invention is not limited to the examples set forth herein. In the embodiment given as an example of the present invention, only the enhanced data packet outputted from the demodulating unit 902 is inputted to the demultiplexer 903. In this case, the main data packet is inputted to another demultiplexer (not shown) that processes main data packets. Herein, the storage controller 914 is also connected to the other demultiplexer in order to store the main data after processing the main data packets. The demultiplexer of the present invention may also be designed to process both enhanced data packets and main data packets in a single demultiplexer.

The storage controller 914 is interfaced with the demultipelxer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 16, the corresponding enhanced data and/or main data that are inputted to the demultiplexer are stored in the third memory 915 in accordance with the control of the storage controller 914. The third memory 915 may be described as a temporary storage area and/or a permanent storage area. Herein, the temporary storage area is used for the time shifting function, and the permanent storage area is used for a permanent storage of data according to the user's choice (or decision).

When the data stored in the third memory 915 need to be reproduced (or played), the storage controller 914 reads the corresponding data stored in the third memory 915 and outputs the read data to the corresponding demultiplexer (e.g., the enhanced data are outputted to the demultiplexer 903 shown in FIG. 16). At this point, according to the embodiment of the present invention, since the storage capacity of the third memory 915 is limited, the compression encoded enhanced data and/or main data that are being inputted are directly stored in the third memory 915 without any modification for the efficiency of the storage capacity. In this case, depending upon the reproduction (or reading) command, the data read from the third memory 915 pass trough the demultiplexer so as to be inputted to the corresponding decoder, thereby being restored to the initial state.

The storage controller 914 may control the reproduction (or play), fast-forward, rewind, slow motion, instant replay functions of the data that are already stored in the third memory 915 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 914 compression encodes the inputted data and stored the compression-encoded data to the third memory 915. In order to do so, the storage controller 914 may include an encoder, wherein the encoder may be embodied as one of software, middleware, and hardware. Herein, an MPEG encoder may be used as the encoder according to an embodiment of the present invention. The encoder may also be provided outside of the storage controller 914.

Meanwhile, in order to prevent illegal duplication (or copies) of the input data being stored in the third memory 915, the storage controller 914 scrambles the input data and stores the scrambled data in the third memory 915. Accordingly, the storage controller 914 may include a scramble algorithm for scrambling the data stored in the third memory 915 and a descramble algorithm for descrambling the data read from the third memory 915. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 903 receives the real-time data outputted from the demodulating unit 902 or the data read from the third memory 915 and demultiplexes the received data. In the example given in the present invention, the demultiplexer 903 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 903 and the subsequent elements.

The demultiplexer 903 demultiplexes enhanced data and program specific information/program and system information protocol (PSI/PSIP) tables from the enhanced data packet inputted in accordance with the control of the data decoder 910. Thereafter, the demultiplexed enhanced data and PSI/PSIP tables are outputted to the data decoder 910 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/ video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/ PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 910, the demultiplexer 903 performs section filtering, thereby discarding repetitive sections and outputting only the non-repetitive sections to the data decoder 910. The demultiplexer 903 may also output only the sections configuring desired tables (e.g., VCT) to the data decoder 910 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 903 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 903 may output only an application information table (AIT) to the data decoder 910 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05' may be assigned to a stream_type field of the PMT. The AIT may include application information, such as application name, application version, application priority, application ID, application status (La, auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 911 by the data decoder 910.

The data decoder 910 parses the DSM-CC section configuring the demultiplexed enhanced data. Then, the enhanced data corresponding to the parsed result are stored as a database in the second memory 911. The data decoder 910 groups a plurality of sections having the same table identification (table_id) so as to configure a table, which is then parsed. Thereafter, the parsed result is stored as a database in the second memory 911. At this point, by parsing data and/or sections, the data decoder 910 reads all of the remaining actual section data that are not section-filtered by the demultiplexer 903. Then, the data decoder 910 stores the read data to the second memory 911. The second memory 911 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 911 or be outputted to the data broadcasting application manager 913. In addition, reference may be made to the application identification information, service component identification information, and service information in order to decode the data service data. Alternatively, such information may also prepare the operation of the application program for the data service. Furthermore, the data decoder 910 controls the demultiplexing of the system information table, which corresponds to the information table associated with the channel and events. Thereafter, an A.V PID list may be transmitted to the channel manager 907.

The channel manager 907 may refer to the channel map 908 in order to transmit a request for receiving system-related information data to the data decoder 910, thereby receiving the corresponding result. In addition, the channel manager 907 may also control the channel tuning of the tuner 901. Furthermore, the channel manager 907 may directly control the demultiplexer 903, so as to set up the A/V PID, thereby controlling the audio decoder 904 and the video decoder 905. The audio decoder 904 and the video decoder 905 may respectively decode and output the audio data and video data demultiplexed from the main data packet. Alternatively, the audio decoder 904 and the video decoder 905 may respectively decode and output the audio data and video data demultiplexed from the enhanced data packet. Meanwhile, when the enhanced data include data service data, and also audio data and video data, it is apparent that the audio data and video data demultiplexed by the demultiplexer 903 are respectively decoded by the audio decoder 904 and the video decoder 905. For example, an audio-coding (AC)-3 decoding algorithm may be applied to the audio decoder 904, and a MPEG-2 decoding algorithm may be applied to the video decoder 905.

Meanwhile, the native TV application manager 906 operates a native application program stored in the first memory 909, thereby performing general functions such as channel change. The native application program refers to software stored in the receiving system upon shipping of the product. More specifically, when a user request (or command) is transmitted to the receiving system through a user interface (UI), the native TV application manger 906 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 906 and the data broadcasting application manager 913. Furthermore, the native TV application manager 906 controls the channel manager 907, thereby controlling channel-associated, such as the management of the channel map 908, and controlling the data decoder 910. The native TV application manager 906 also controls the GUI of the overall receiving system, thereby storing the user request and status of the receiving system in the first memory 909 and restoring the stored information.

The channel manager 907 controls the tuner 901 and the data decoder 910, so as to managing the channel map 908 so that it can respond to the channel request made by the user. More specifically, channel manager 907 sends a request to the data decoder 910 so that the tables associated with the channels that are to be tuned are parsed. The results of the parsed tables are reported to the channel manager 907 by the data decoder 910. Thereafter, based on the parsed results, the channel manager 907 updates the channel map 908 and sets up a PID in the demultiplexer 903 for demultiplexing the tables associated with the data service data from the enhanced data.

The system manager 912 controls the booting of the receiving system by turning the power on or off. Then, the system manager 912 stores ROM images (including downloaded software images) in the first memory 909. More specifically, the first memory 909 stores management programs such as operating system (OS) programs required for managing the receiving system and also application program executing data service functions. The application program is a program processing the data service data stored in the second memory 911 so as to provide the user with the data service. If the data service data are stored in the second memory 911, the corresponding data service data are processed by the above-described application program or by other application programs, thereby being provided to the user. The management program and application program stored in the first memory 909 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 909 upon the shipping of the receiving system, or be stored in the first 909 after being downloaded. The application program for the data service (i.e., the data service providing application program) stored in the first memory 909 may also be deleted, updated, and corrected. Furthermore, the data service providing application program may be downloaded and executed along with the data service data each time the data service data are being received.

When a data service request is transmitted through the user interface, the data broadcasting application manager 913 operates the corresponding application program stored in the first memory 909 so as to process the requested data, thereby providing the user with the requested data service. And, in order to provide such data service, the data broadcasting application manager 913 supports the graphic user interface (GUI). Herein, the data service may be provided in the form of text (or short message service (SMS)), voice message, still image, and moving image. The data broadcasting application manager 913 may be provided with a platform for executing the application program stored in the first memory 909. The platform may be, for example, a Java virtual machine for executing the Java program. Hereinafter, an example of the data broadcasting application manager 913 executing the data service providing application program stored in the first memory 909, so as to process the data service data stored in the second memory 911, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 16, the GPS module receives satellite signals transmitted from a plurality of low earth orbit satellites and extracts the current position (or location) information (e.g., longitude, latitude, altitude), thereby outputting the extracted information to the data broadcasting application manager 913.

At this point, it is assumed that the electronic map including information on each link and nod and other diverse graphic information are stored in one of the second memory 911, the first memory 909, and another memory that is not shown. More specifically, according to the request made by the data broadcasting application manager 913, the data service data stored in the second memory 911 are read and inputted to the data broadcasting application manager 913. The data broadcasting application manager 913 translates (or deciphers) the data service data read from the second memory 911, thereby extracting the necessary information according to the contents of the message and/or a control signal.

Figure 17:
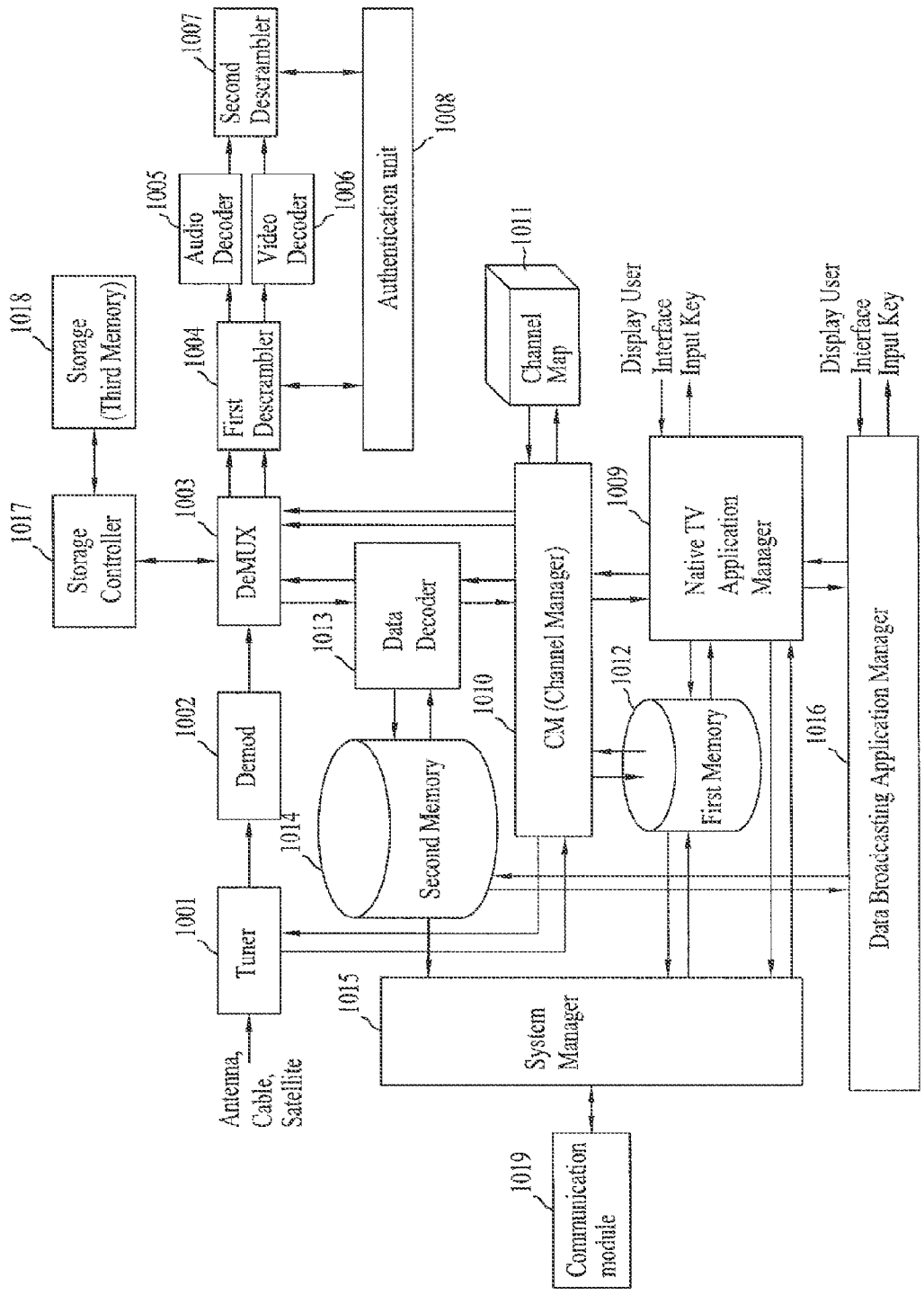
FIG. 17 illustrates a block diagram showing the structure of a digital broadcast (or television or DTV) receiving system according to another embodiment of the present invention.

FIG. 17 illustrates a block diagram showing the structure of a digital broadcast (or television) receiving system according to another embodiment of the present invention.

Referring to FIG. 17, the digital broadcast receiving system includes a tuner 1001, a demodulating unit 1002, a demultiplexer 1003, a first descrambler 1004, an audio decoder 1005, a video decoder 1006, a second descrambler 1007, an authentication unit 1008, a native TV application manager 1009, a channel manager 1010, a channel map 1011, a first memory 1012, a data decoder 1013, a second memory 1014, a system manager 1015, a data broadcasting application manager 1016, a storage controller 1017, a third memory 1018, and a telecommunication module 1019. Herein, the third memory 1018 is a mass storage device, such as a hard disk drive (HDD) or a memory chip. Also, during the description of the digital broadcast (or television or DTV) receiving system shown in FIG. 17, the components that are identical to those of the digital broadcast receiving system of FIG. 16 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 1004 and 1007, and the authentication means will be referred to as an authentication unit 1008. Such naming of the corresponding components is merely exemplary and is not limited to the terms suggested in the description of the present invention. For example, the units may also be referred to as a decryptor. Although FIG. 17 illustrates an example of the descramblers 1004 and 1007 and the authentication unit 1008 being provided inside the receiving system, each of the descramblers 1004 and 1007 and the authentication unit 1008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 1008, the scrambled broadcasting contents are descrambled by the descramblers 1004 and 1007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 1008 and the descramblers 1004 and 1007 will now be described in detail. The receiving system receives the scrambled broadcasting contents through the tuner 1001 and the demodulating unit 1002. Then, the system manager 1015 decides whether the received broadcasting contents have been scrambled. Herein, the demodulating unit 1002 may be included as a demodulating means according to embodiments of the present invention as described in FIG. 11 and FIG. 15. However, the present invention is not limited to the examples given in the description set forth herein. If the system manager 1015 decides that the received broadcasting contents have been scrambled, then the system manager 1015 controls the system to operate the authentication unit 1008. As described above, the authentication unit 1008 performs an authentication process in order to decide whether the receiving system according to the present invention corresponds to a legitimate host entitled to receive the paid broadcasting service. Herein, the authentication process may vary in accordance with the authentication methods.

For example, the authentication unit 1008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 1008 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 1008 performs the authentication process by determining the conformity between the address of the corresponding receiving system and the system information of the receiving system that is mapped with the IP address. In other words, if the authentication unit 1008 determines that the two types of information conform to one another, then the authentication unit 1008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 1008 of the receiving system extracts the identification information of the receiving system and the identification information included in the EMM of the broadcasting service that is being received. Then, the authentication unit 1008 determines whether the identification information conform to each other, so as to perform the authentication process. More specifically, if the authentication unit 1008 determines that the information conform to each other, then the authentication unit 1008 eventually determines that the receiving system is entitled to receive the request broadcasting service.

In yet another example, the authentication unit 1008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 1015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 1015 transmits the payment information to the remote transmitting system through the telecommunication module 1019.

The authentication unit 1008 authenticates the corresponding receiving system and/or the external module. Then, if the authentication process is successfully completed, the authentication unit 1008 certifies the corresponding receiving system and/or the external module as a legitimate system and/or module entitled to receive the requested paid broadcasting service. In addition, the authentication unit 1008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 1008, the receiving system may descramble the scrambled broadcasting contents received from the transmitting system. At this point, the descrambling process is performed by the first and second descramblers 1004 and 1007. Herein, the first and second descramblers 1004 and 1007 may be included in an internal module or an external module of the receiving system.

The receiving system is also provided with a common interface for communicating with the external module including the first and second descramblers 1004 and 1007, so as to perform the descrambling process. More specifically, the first and second descramblers 1004 and 1007 may be included in the module or in the receiving system in the form of hardware, middleware or software. Herein, the descramblers 1004 and 1007 may be included in any one of or both of the module and the receiving system. If the first and second descramblers 1004 and 1007 are provided inside the receiving system, it is advantageous to have the transmitting system (i.e., at least any one of a service provider and a broadcast station) scramble the corresponding data using the same scrambling method.

Alternatively, if the first and second descramblers 1004 and 1007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 1015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 1012 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 1008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 1008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 1015, then the memory card is verified and determined to be a normal memory card that may be used in the receiving system. At this point, the CAS software may either be installed in the first memory 1012 upon the shipping of the present invention, or be downloaded to the first memory 1012 from the transmitting system or the module or memory card, as described above. Herein, the descrambling function may be operated by the data broadcasting application manger 1016 as an application program.

Thereafter, the CAS software parses the EMM/ECM packets outputted from the demultiplexer 1003, so as to verify whether the receiving system is entitled to receive the corresponding data, thereby obtaining the information required for descrambling (i.e., the CW) and providing the obtained CW to the descramblers 1004 and 1007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 1004 and 1007. Each of the descramblers 1004 and 1007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 1004 and 1007 may be included in the module either in the form of hardware or in the form of software. In this case, the scrambled data that being received are descrambled by the module and then demodulated. Also, if the scrambled data that are being received are stored in the third memory 1018, the received data may be descrambled and then stored, or stored in the memory at the point of being received and then descrambled later on prior to being played (or reproduced). Thereafter, in case scramble/descramble algorithms are provided in the storage controller 1017, the storage controller 1017 scrambles the data that are being received once again and then stores the re-scrambled data to the third memory 1018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 1019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 1019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 1019 may also be configured. Also, the PDU may be configured in the Java application of the receiving system and then outputted to the telecommunication module 1019. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1×EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 1019.

The broadcasting data being transmitted and received through the above-described wireless data network may include data required for performing the function of limiting data reception. Meanwhile, the demultiplexer 1003 receives either the real-time data outputted from the demodulating unit 1002 or the data read from the third memory 1018, thereby performing demultiplexing. In this embodiment of the present invention, the demultiplexer 1003 performs demultiplexing on the enhanced data packet. Similar process steps have already been described earlier in the description of the present invention. Therefore, a detailed of the process of demultiplexing the enhanced data will be omitted for simplicity.

The first descrambler 1004 receives the demultiplexed signals from the demultiplexer 1003 and then descrambles the received signals. At this point, the first descrambler 1004 may receive the authentication result received from the authentication unit 1008 and other data required for the descrambling process, so as to perform the descrambling process. The audio decoder 1005 and the video decoder 1006 receive the signals descrambled by the first descrambler 1004, which are then decoded and outputted. Alternatively, if the first descrambler 1004 did not perform the descrambling process, then the audio decoder 1005 and the video decoder 1006 directly decode and output the received signals. In this case, the decoded signals are received and then descrambled by the second descrambler 1007 and processed accordingly.

As described above, the present invention has the following advantages. More specifically, the present invention is highly protected against (or resistant to) any error that may occur when transmitting additional data through a channel. And, the present invention is also highly compatible to the conventional receiving system. Moreover, the present invention may also receive the additional data without any error even in channels having severe ghost effect and noise.

Additionally, by grouping a plurality of enhanced data packets, by layering the group to a plurality of areas when multiplexing the group with the main data and transmitting the multiplexed data, and by identifying the data type, processing method, and so on according to the characteristic of each layered area, the receiving function of the receiving system may be enhanced. Moreover, by performing at least any one of the error correction coding process and the error detection coding process on the enhanced data, and by performing a row permutation process, the enhanced data may become robust, thereby being able to take strong countermeasures against the constantly changing channel environment.

Furthermore, by performing additional error correction encoding, randomizing, and deinterleaving processes before multiplexing the enhanced data and the main data, the structure of the digital television transmitting system may be simplified. Finally, the present invention is even more effective in providing robustness when applied to mobile and portable receivers, which are also liable to a frequent change in channel and which require robustness against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of processing broadcast data in a broadcast transmitter, the method comprising:
   adding padding data to first data;
   randomizing the first data to which the padding data are added;
   encoding the randomized first data at a first code rate;
   first interleaving the encoded first data;
   converting the first-interleaved first data to symbols;
   second interleaving the first data converted to the symbols;
   encoding signaling data for signaling the first data at a second code rate;
   first interleaving the encoded signaling data;
   converting the first-interleaved signaling data to symbols;
   second interleaving the signaling data converted to the symbols;
   modulating data in a frame that includes the second interleaved first data and the second interleaved signaling data; and transmitting the modulated data,
wherein the frame further includes second data multiplexed with the first data,
wherein the signaling data include multiplexing information,
wherein the frame further includes known data, wherein the known data include a first type of known data and a second type of known data other than the first type of known data, and
wherein at least one of the first type of known data and the second type of known data are used for channel estimation in a broadcast receiver.

2. The method of claim 1, wherein first interleaving the encoded first data performs block interleaving on the encoded first data.

3. The method of claim 1, wherein first interleaving the signaling data performs block interleaving on the signaling data.

4. The method of claim 1, wherein the second type of known data are inserted into pre-determined positions within the frame.

5. A broadcast transmitter for processing broadcast data, the broadcast transmitter comprising:
a first processor to add padding data to first data and randomize the first data to which the padding data are added;
an encoder to encode the randomized first data at a first code rate and encode signaling data for signaling the first data at a second code rate;
an interleaver to first interleave the encoded first data and first interleave the encoded signaling data;
a second processor to convert the first-interleaved first data to symbols, second interleave the first data converted to the symbols, convert the first-interleaved signaling data to symbols, and second interleave the signaling data converted to the symbols;
a modulator to modulate data in a frame that includes the second interleaved first data and the second interleaved signaling data; and
a transmitting unit to transmit the modulated data,
wherein the frame further includes second data multiplexed with the first data,
wherein the signaling data include multiplexing information,
wherein the frame further includes known data, wherein the known data include a first type of known data and a second type of known data other than the first type of known data, and
wherein at least one of the first type of known data and the second type of known data are used for channel estimation in a broadcast receiver.

6. The broadcast transmitter of claim 5, wherein the interleaver performs block interleaving on the encoded first data.

7. The broadcast transmitter of claim 5, wherein the interleaver performs block interleaving on the signaling data.

8. The broadcast transmitter of claim 5, wherein the second type of known data are inserted into pre-determined positions within the frame.

* * * * *